(12) United States Patent
Huang

(10) Patent No.: US 11,488,905 B2
(45) Date of Patent: Nov. 1, 2022

(54) SEMICONDUCTOR DEVICE STRUCTURE WITH MANGANESE-CONTAINING CONDUCTIVE PLUG AND METHOD FOR FORMING THE SAME

(71) Applicant: NANYA TECHNOLOGY CORPORATION, New Taipei (TW)

(72) Inventor: Teng-Yen Huang, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/115,330

(22) Filed: Dec. 8, 2020

(65) Prior Publication Data

US 2022/0181260 A1 Jun. 9, 2022

(51) Int. Cl.
*H01L 23/535* (2006.01)
*H01L 23/532* (2006.01)
*H01L 21/768* (2006.01)
*H01L 27/108* (2006.01)

(52) U.S. Cl.
CPC ........ *H01L 23/535* (2013.01); *H01L 21/7682* (2013.01); *H01L 21/76805* (2013.01); *H01L 21/76843* (2013.01); *H01L 21/76865* (2013.01); *H01L 21/76895* (2013.01); *H01L 23/5329* (2013.01); *H01L 23/53238* (2013.01); *H01L 23/53266* (2013.01); *H01L 27/10805* (2013.01)

(58) Field of Classification Search
CPC ............. H01L 23/535; H01L 21/76805; H01L 21/7682; H01L 21/76843; H01L 21/76865; H01L 21/76895; H01L 23/53238; H01L 23/53266; H01L 23/5329; H01L 27/10805
See application file for complete search history.

(56) References Cited

U.S. PATENT DOCUMENTS

| 2013/0065394 A1* | 3/2013 | Suen ................ H01L 21/3212 257/E21.159 |
| 2017/0213792 A1* | 7/2017 | Nag ................ H01L 21/76877 |
| 2022/0037191 A1* | 2/2022 | Huang .............. H01L 21/76883 |

* cited by examiner

*Primary Examiner* — Shahed Ahmed
*Assistant Examiner* — Vicki B. Booker
(74) *Attorney, Agent, or Firm* — Muncy, Geissler, Olds & Lowe, P.C.

(57) ABSTRACT

The present disclosure provides a semiconductor device structure with a manganese-containing conductive plug and a method for forming the semiconductor device structure. The semiconductor device structure includes a first conductive layer disposed over a semiconductor substrate, and a dielectric layer disposed over the first conductive layer. The semiconductor device structure also includes a first conductive plug penetrating through the dielectric layer and in a pattern-dense region, and a lining layer covering the dielectric layer and the first conductive plug. The lining layer and the first conductive plug include manganese. The semiconductor device structure further includes a second conductive plug penetrating through the lining layer and the dielectric layer and in a pattern-loose region. The second conductive plug is separated from the dielectric layer by a portion of the lining layer. In addition, the semiconductor device structure includes a second conductive layer covering the lining layer and the second conductive plug.

13 Claims, 20 Drawing Sheets

SEMICONDUCTOR DEVICE STRUCTURE WITH MANGANESE-CONTAINING CONDUCTIVE PLUG AND METHOD FOR FORMING THE SAME

TECHNICAL FIELD

The present disclosure relates to a semiconductor device structure and a method for forming the same, and more particularly, to a semiconductor device structure with a manganese-containing conductive plug and a method for forming the same.

DISCUSSION OF THE BACKGROUND

Semiconductor devices are essential for many modern applications. With the advancement of electronic technology, semiconductor devices are becoming smaller in size while providing greater functionality and including greater amounts of integrated circuitry. Due to the miniaturized scale of semiconductor devices, various types and dimensions of semiconductor devices providing different functionalities are integrated and packaged into a single module. Furthermore, numerous manufacturing operations are implemented for integration of various types of semiconductor devices.

However, the manufacturing and integration of semiconductor devices involve many complicated steps and operations. Integration in semiconductor devices becomes increasingly complicated. An increase in complexity of manufacturing and integration of the semiconductor device may cause deficiencies, such as void formed in conductive structure, which results from the difficulties in filling a high aspect ratio opening. Accordingly, there is a continuous need to improve the manufacturing process of semiconductor devices so that the problems can be addressed.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a semiconductor device is provided. The semiconductor device includes a first conductive layer disposed over a semiconductor substrate, and a dielectric layer disposed over the first conductive layer. The semiconductor device structure also includes a first conductive plug penetrating through the dielectric layer and in a pattern-dense region, and a lining layer covering the dielectric layer and the first conductive plug. The lining layer and the first conductive plug include manganese. The semiconductor device structure further includes a second conductive plug penetrating through the lining layer and the dielectric layer and in a pattern-loose region. The second conductive plug is separated from the dielectric layer by a portion of the lining layer. In addition, the semiconductor device structure includes a second conductive layer covering the lining layer and the second conductive plug.

In an embodiment, the lining layer is in direct contact with the first conductive plug, and the lining layer and the first conductive plug are made of a same material. In an embodiment, the lining layer and the first conductive plug are made of copper manganese. In an embodiment, the first conductive plug and the second conductive plug are made of different materials. In an embodiment, the second conductive layer is in direct contact with the second conductive plug, and the second conductive layer and the second conductive plug are made of copper.

In an embodiment, the semiconductor device structure further includes an energy removable structure disposed in the pattern-dense region and adjacent to the first conductive plug, wherein the energy removable structure is disposed between the lining layer and the first conductive layer. In an embodiment, the semiconductor device structure further includes an airgap enclosed by the energy removable structure.

In another embodiment of the present disclosure, a semiconductor device is provided. The semiconductor device includes a first conductive layer disposed over a semiconductor substrate, and a second conductive layer disposed over the first conductive layer. The semiconductor device structure also includes a plurality of first conductive plugs disposed in a pattern-dense region and between the first conductive layer and the second conductive layer, and a plurality of second conductive plugs disposed in a pattern-loose region and between the first conductive layer and the second conductive layer. The semiconductor device structure further includes an energy removable structure disposed between the plurality of first conductive plugs. An air gap is enclosed by the energy removable structure. In addition, the semiconductor device structure includes a lining layer disposed between the plurality of first conductive plugs and the second conductive layer. The lining layer and the plurality of first conductive plugs include manganese.

In an embodiment, the lining layer and the plurality of first conductive plugs are made of a first material, the plurality of second conductive plugs and the second conductive layer are made of a second material, and the first material is different from the second material. In an embodiment, the first material is copper manganese, and the second material is copper. In an embodiment, the semiconductor device structure further includes a dielectric layer disposed between the first conductive layer and the second conductive layer, wherein the plurality of second conductive plugs are surrounded by the dielectric layer, the lining layer extends between the dielectric layer and the second conductive layer, and each of the plurality of second conductive plugs is separated from the dielectric layer by the lining layer.

In an embodiment, a first distance between an adjacent pair of the plurality of first conductive plugs is less than a second distance between an adjacent pair of the plurality of second conductive plugs. In an embodiment, the plurality of first conductive plugs and the plurality of second conductive plugs are electrically connected to the first conductive layer and the second conductive layer.

In yet another embodiment of the present disclosure, a method for forming a semiconductor device structure is provided. The method includes forming a first conductive layer over a semiconductor substrate, and forming a dielectric layer over the first conductive layer. The method also includes replacing a portion of the dielectric layer with an energy removable layer, and performing an etching process to form a first opening in the energy removable layer and a second opening in the dielectric layer. The first opening is in a pattern-dense region and the second opening is in a pattern-loose region. The method further includes depositing a lining layer over the energy removable layer and the dielectric layer. The lining layer entirely fills the first opening to form a first conductive plug, and the lining layer partially fills the second opening. In addition, the method includes forming a second conductive plug in a remaining portion of the second opening, and forming a second conductive layer over the lining layer and the second conductive plug.

In an embodiment, a width of the first opening is less than a width of the second opening. In an embodiment, the etching process further forms a third opening in the pattern-dense region and adjacent to the first opening and fourth opening in the pattern-loose region and adjacent to the second opening, wherein a distance between the first opening and the third opening is less than a distance between the second opening and the fourth opening. In an embodiment, the first conductive plug is made of copper manganese, and the second conductive plug is made of copper.

In an embodiment, the method further includes partially removing the lining layer in the second opening to expose the first conductive layer before the second conductive plug is formed. In an embodiment, the second conductive plug and the second conductive layer are formed simultaneously in same process steps. In an embodiment, the method further includes performing a heat treatment process to partially transform the energy removable layer into an air gap after the second conductive layer is formed.

Embodiments of a semiconductor device structure and method for forming the same are provided in the disclosure. In some embodiments, the semiconductor device structure includes a first conductive plug penetrating through a dielectric layer and in a pattern-dense region, a lining layer covering the dielectric layer and the first conductive plug, and a second conductive plug penetrating through the lining layer and the dielectric layer and in a pattern-loose region. The lining layer and the first conductive plug include manganese, the second conductive plug is separated from the dielectric layer by the lining layer. The manganese-containing conductive plug (i.e., the first conductive plug in the pattern-dense region) and the lining layer may be integrally formed, thereby reducing manufacturing cost. Moreover, the lining layer may reduce or prevent voids from forming in the subsequently formed conductive plug (i.e., the second conductive plug in the pattern-loose region), thereby decreasing the contact resistance. As a result, the operation speed of the semiconductor device structure may be increased, which significantly improves the overall device performance.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
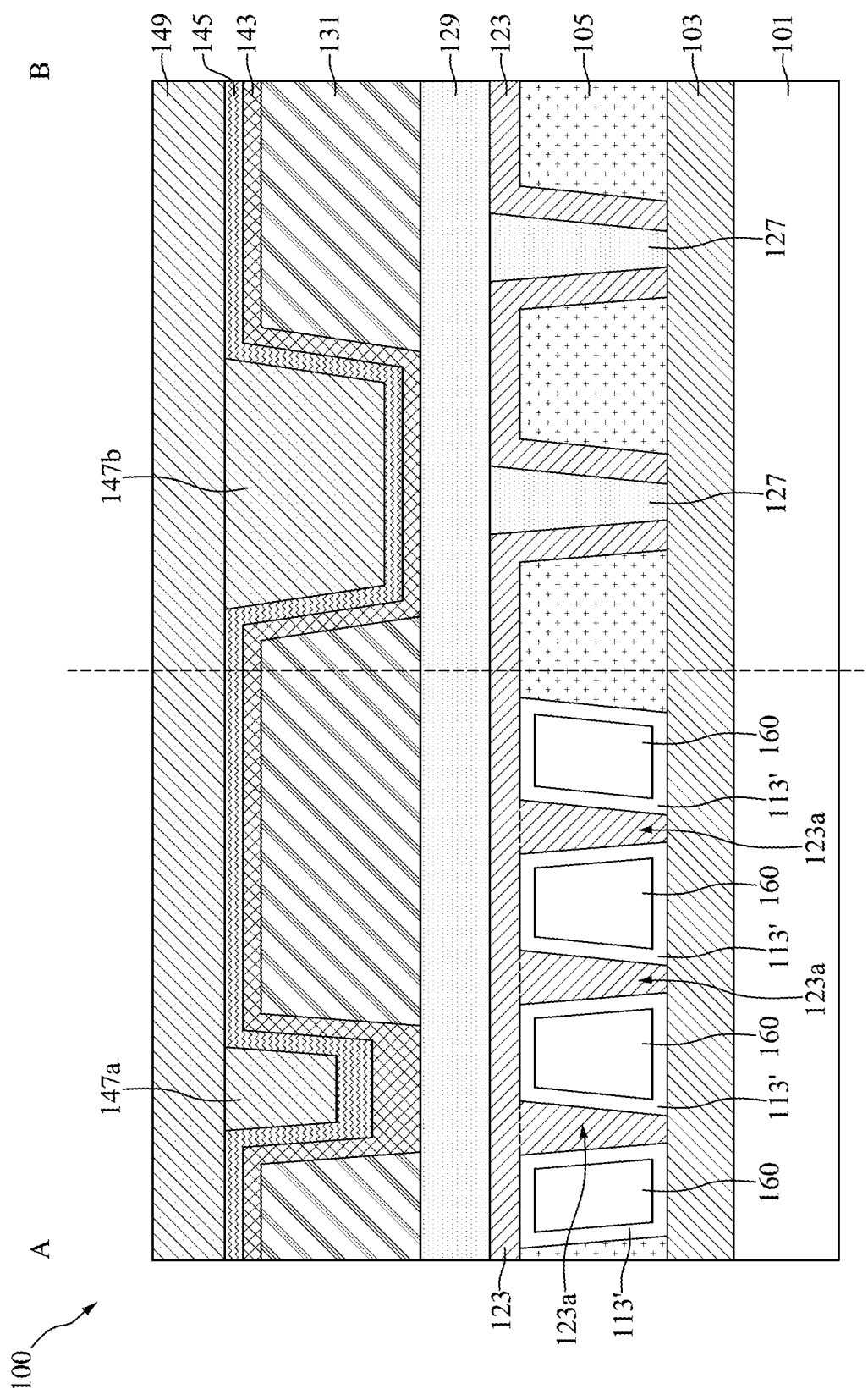
FIG. 1 is a cross-sectional view illustrating a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a cross-sectional view illustrating a semiconductor device structure 100, in accordance with some embodiments. As shown in FIG. 1, the semiconductor device structure 100 includes a first conductive layer 103 disposed over a semiconductor substrate 101, a dielectric layer 105 disposed over the first conductive layer 103, a second conductive layer 129 disposed over the dielectric layer 105, a dielectric layer 131 disposed over the second conductive layer 129, and a third conductive layer 149 disposed over the dielectric layer 131, as shown in FIG. 1 in accordance with some embodiments. Moreover, the semiconductor device structure 100 has a pattern-dense region A and a pattern-loose region B. In order to clarify the disclosure, the dotted line in the middle of FIG. 1 is used to indicate the boundary of the pattern-dense region A and the pattern-loose region B.

In some embodiments, the semiconductor-device structure 100 includes a plurality of first conductive plugs 123a penetrating through the dielectric layer 105 and in the pattern-dense region A. Moreover, the semiconductor device structure 100 includes energy removable structures 113' disposed in the dielectric layer 105 and in the pattern-dense region A. Specifically, the first conductive plugs 123a are surrounded by the energy removable structures 113', and each of the energy removable structures 113' includes an air gap 160.

In some embodiments, the air gaps 160 are enclosed by the energy removable structures 113'. Although four energy removable structures 113' are shown in the cross-sectional view of FIG. 1, the four energy removable structures 113' may be connected to each other in different cross-sectional views. Similar to the energy removable structures 113', the four air gaps 160 shown in the cross-sectional view of FIG. 1 may also be connected to each other in different cross-sectional views. It should be noted that the numbers of the energy removable structures 113' and the air gaps 160 may be adjusted depending on design requirements of the semiconductor device structure 100.

Still referring to FIG. 1, the semiconductor device structure 100 includes a lining layer 123 disposed between the dielectric layer 105 and the second conductive layer 129, and the energy removable structures 113' and the first conductive plugs 123a are covered by the lining layer 123. In some embodiments, the dashed lines indicating the boundaries of the first conductive plugs 123a and the lining layer 123 are used to clarify the disclosure. No obvious interfaces exist between the first conductive plugs 123a and the lining layer 123.

The semiconductor device structure 100 also includes a plurality of second conductive plugs 127 penetrating through the lining layer 123 and the dielectric layer 105 and in the pattern-loose region B. Specifically, in the pattern-loose region B, the lining layer 123 extends between the dielectric layer 105 and the second conductive plugs 127. In some embodiments, the second conductive plugs 127 are separated from the dielectric layer 105 by the lining layer 123.

In addition, the semiconductor device structure 100 includes a lining layer 143, a lining layer 145, a first conductive structure 147a and a second conductive structure 147b disposed between the second conductive layer 129 and the third conductive layer 149. In some embodiments, the first conductive structure 147a is in the pattern-dense region A, and the second conductive structure 147b is in the pattern-loose region B. In some embodiments, portions of the lining layers 143 and 145 are sandwiched between the dielectric layer 131 and the third conductive layer 149. In some embodiments, the lining layer 145 is disposed over the lining layer 143, and the sidewalls and bottom surfaces of the first conductive structure 147a and the second conductive structure 147b are covered by the lining layer 145.

In some embodiments, the semiconductor device structure 100 is a dynamic random access memory (DRAM). In these cases, the conductive layers (e.g., the first conductive layer 103, the second conductive layer 129 and the third conductive layer 149) can serve as bit lines (BL), storage nodes and/or wiring layers for the DRAM, and the conductive plugs (e.g., the first conductive plugs 123a and the second conductive plugs 127) and the conductive structures (e.g., the first conductive structure 147a and the second conductive structure 147b) can serve as bit line contact plugs, capacitor contact plugs and/or interconnect structures for the DRAM.

In some embodiments, the first conductive plugs 123a in the pattern-dense region A and the lining layer 123 are integrally formed. In some embodiments, the first conductive plugs 123a and the lining layer 123 are made of the same material, and the first conductive plugs 123a and the second conductive plugs 127 are made of different materials. In some embodiments, the first conductive plugs 123a and the lining layer 123 are made of a manganese-containing material.

For example, the lining layer 123 and the first conductive plugs 123a are each made of (or include) copper manganese (CuMn), and the first conductive layer 103, the second conductive layer 129 and the second conductive plugs 127 are each made of (or include) copper (Cu), in accordance with some embodiments. Additionally, in some embodiments, the first conductive structure 147a, the second conductive structure 147b and the third conductive layer 149 are each made of (or include) copper (Cu), the lining layer 143 is made of (or include) manganese-rich manganese silicon (MnSi) or manganese (Mn), and the lining layer 145 is made of (or include) copper manganese (CuMn).

Figure 2:
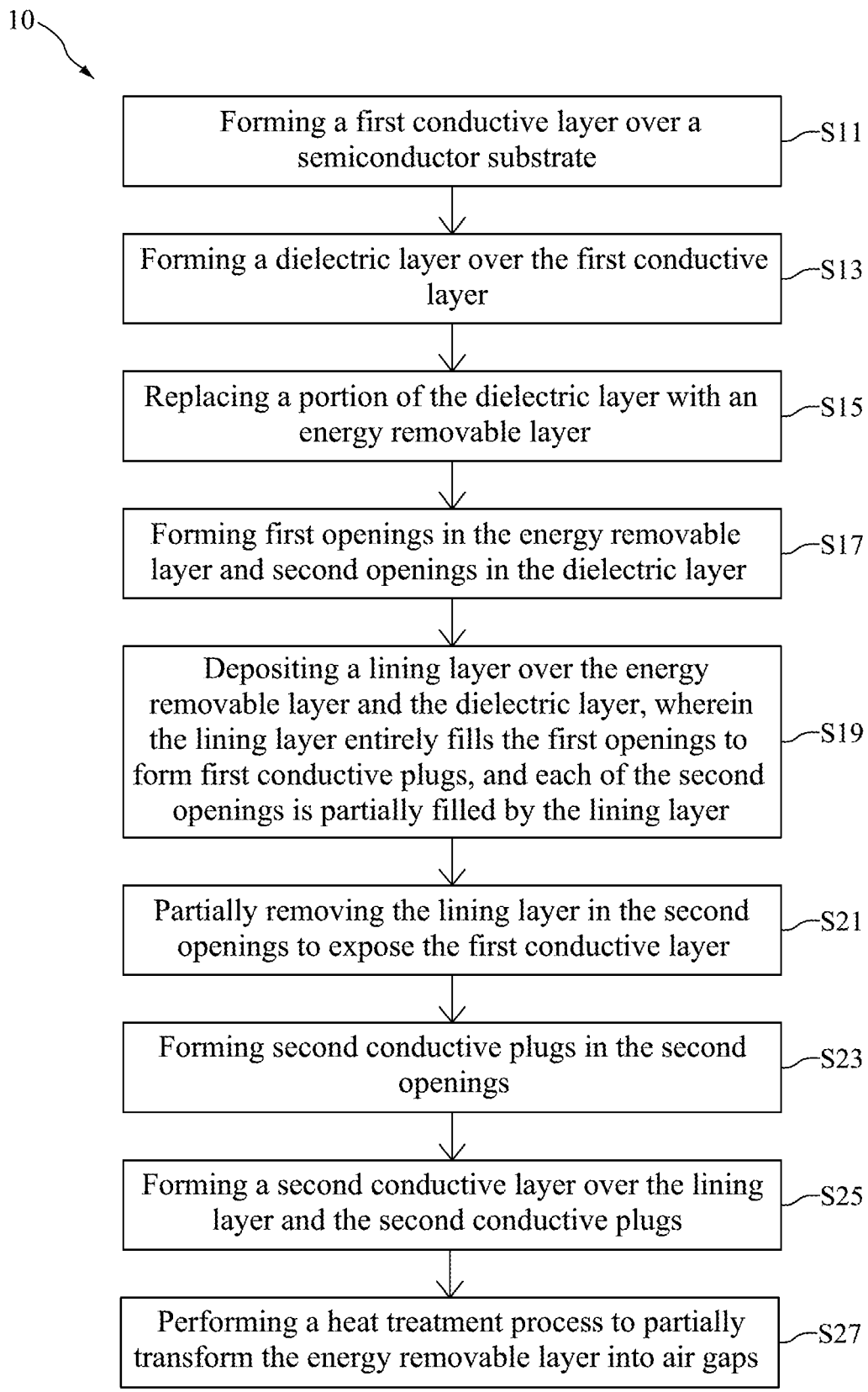
FIG. 2 is a flow diagram illustrating a method for forming a semiconductor device structure, in accordance with some embodiments.

FIG. 2 is a flow diagram illustrating a method 10 of forming a semiconductor device structure (e.g., the semiconductor device structure 100), and the method 10 includes steps S11, S13, S15, S17, S19, S21, S23, S25 and S27, in accordance with some embodiments. The steps S11 to S27 of FIG. 2 are elaborated in connection with the following figures.

Figure 3:
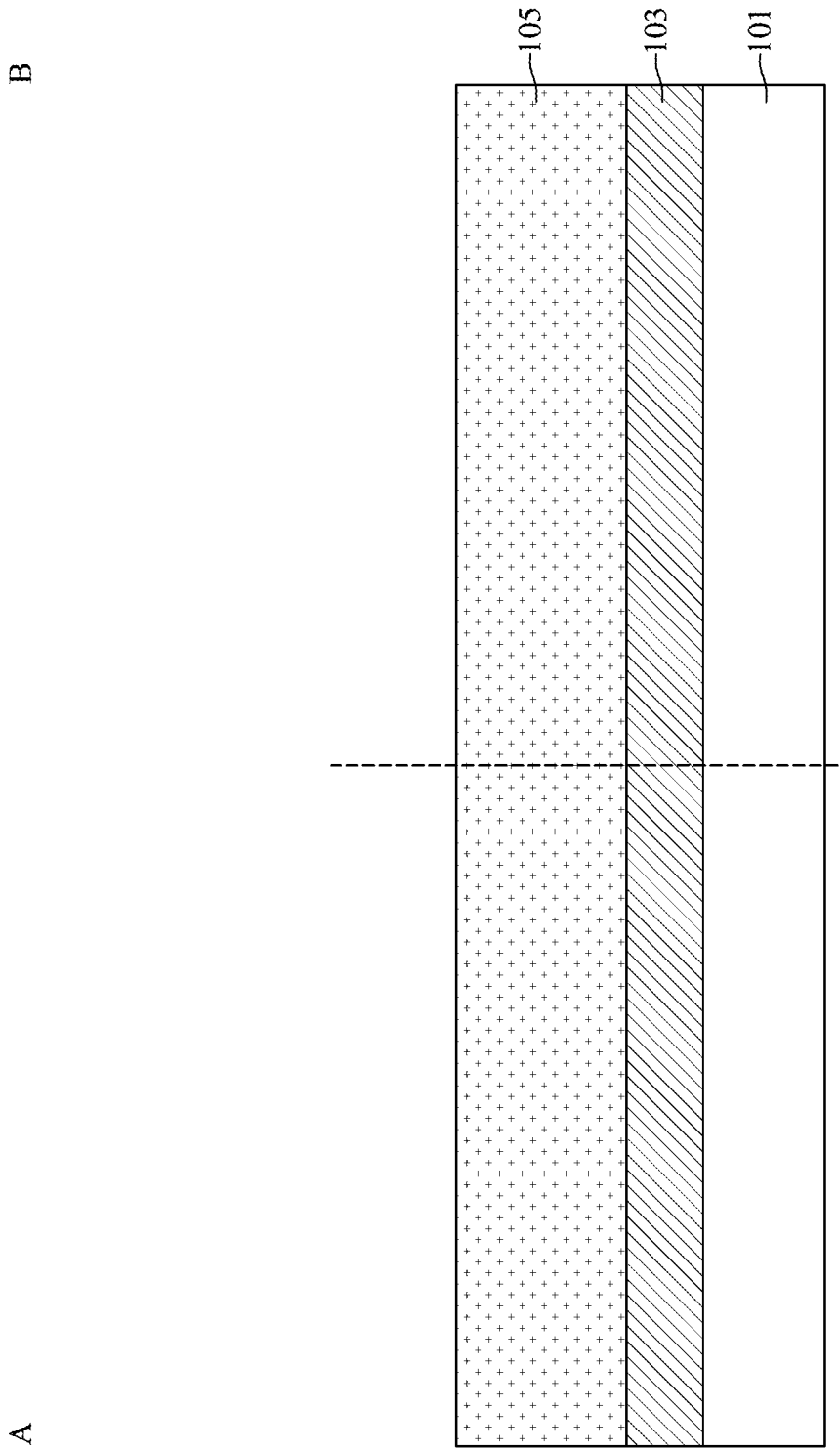
FIG. 3 is a cross-sectional view illustrating an intermediate stage of sequentially forming a first conductive layer and a dielectric layer over a semiconductor substrate during the formation of the semiconductor device structure, in accordance with some embodiments.

FIGS. 3-19 are cross-sectional views illustrating intermediate stages of forming the semiconductor device structure 100, in accordance with some embodiments. As shown in FIG. 3, the semiconductor substrate 101 is provided. The semiconductor substrate 101 may be a semiconductor wafer such as a silicon wafer.

Alternatively or additionally, the semiconductor substrate 101 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP.

In some embodiments, the semiconductor substrate 101 includes an epitaxial layer. For example, the semiconductor substrate 101 has an epitaxial layer overlying a bulk semiconductor. In some embodiments, the semiconductor substrate 101 is a semiconductor-on-insulator substrate which may include a substrate, a buried oxide layer over the substrate, and a semiconductor layer over the buried oxide layer, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other applicable methods.

Still referring to FIG. 3, the first conductive layer 103 is formed over the semiconductor substrate 101, and the dielectric layer 105 is formed over the first conductive layer 103, in accordance with some embodiments. The respective steps are illustrated as the steps S11 and S13 in the method 10 shown in FIG. 2.

In some embodiments, the first conductive layer 103 includes copper (Cu), and the first conductive layer 103 is formed by a deposition process, such as a chemical vapor deposition (CVD) process, a physical vapor deposition (PVD) process, an atomic layer deposition (ALD) process, a metalorganic chemical vapor deposition (MOCVD) process, a sputtering process, a plating process, or another applicable process. In some embodiments, the dielectric layer 105 includes silicon oxide, silicon nitride, silicon oxynitride, or another applicable dielectric material, and the dielectric layer 105 is formed by a deposition process, such as a CVD process, a PVD process, an ALD process, a spin-on coating process, or another applicable process.

Figure 4:
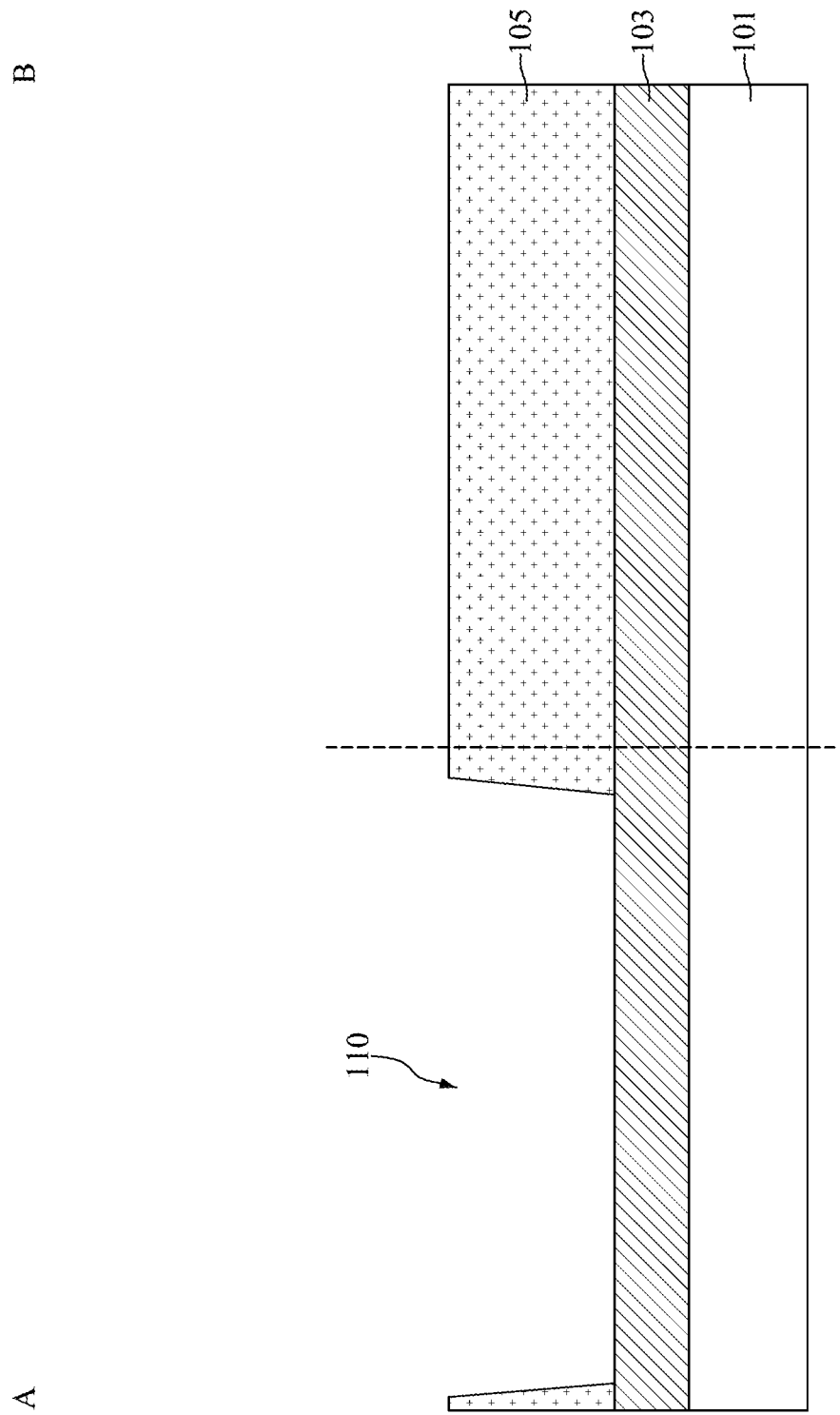
FIG. 4 is a cross-sectional view illustrating an intermediate stage of etching the dielectric layer during the formation of the semiconductor device structure, in accordance with some embodiments.

Next, an etching process is performed on the dielectric layer 105 to form an opening 110 exposing the first conductive layer 103, as shown in FIG. 4 in accordance with some embodiments. In some embodiments, the opening 110 is in the pattern-dense region A. The formation of the opening 110 may include forming a patterned mask (not shown) over the dielectric layer 105, and etching the dielectric layer 105 by using the patterned mask as a mask. In addition, the etching process for forming the opening 110 may be a wet etching process, a dry etching process, or a combination thereof.

Figure 5:
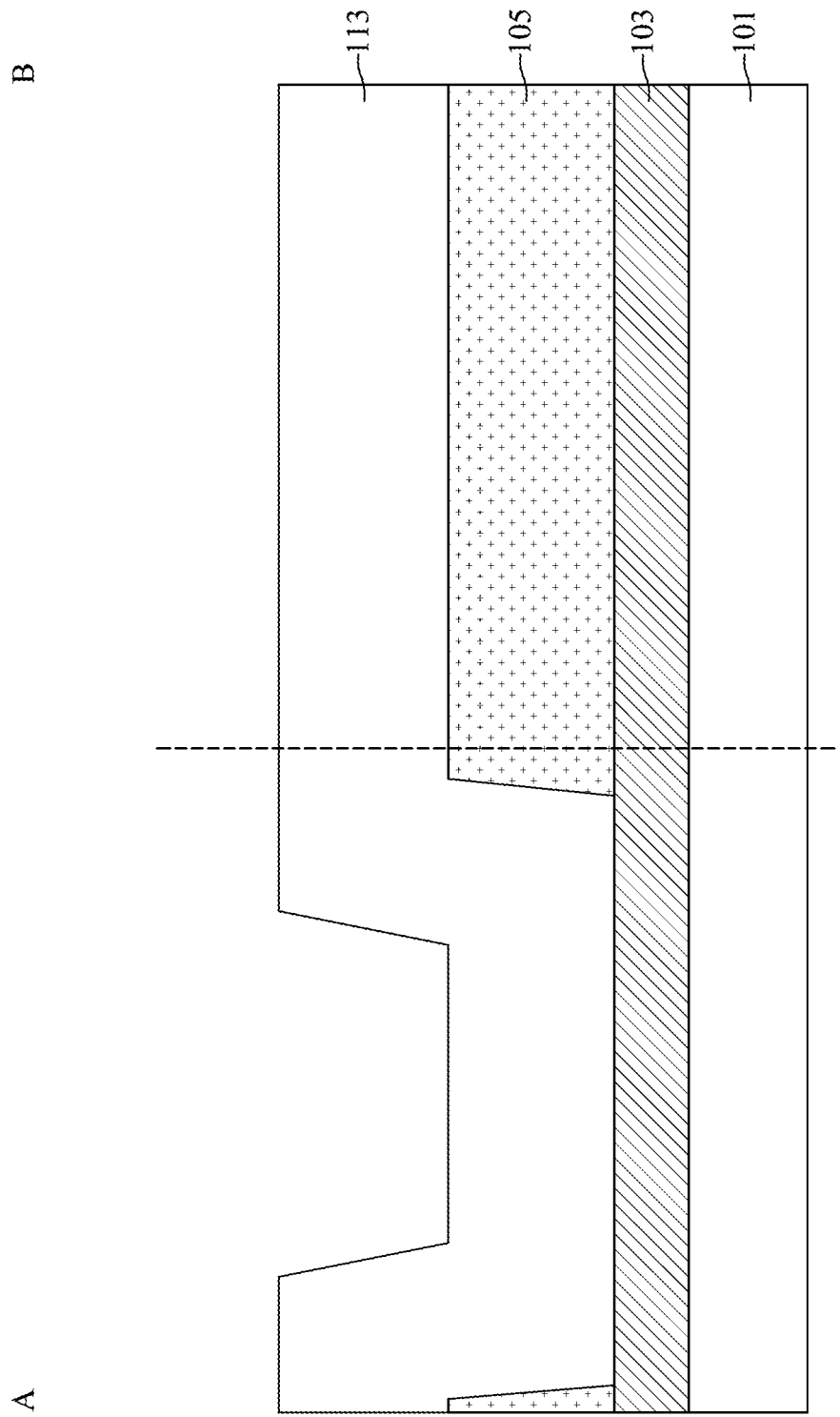
FIG. 5 is a cross-sectional view illustrating an intermediate stage of forming an energy removable layer during the formation of the semiconductor device structure, in accordance with some embodiments.

Subsequently, an energy removable layer 113 is conformally deposited over the dielectric layer 105, as shown in FIG. 5 in accordance with some embodiments. In some embodiments, the sidewalls and the bottom surface of the opening 110 (See FIG. 4) are covered by the energy removable layer 113.

In some embodiments, the materials of the energy removable layer 113 include a base material and a decomposable porogen material that is substantially removed once being exposed to an energy source (e.g., heat). In some embodiments, the base material includes hydrogen silsesquioxane (HSQ), methylsilsesquioxane (MSQ), porous polyarylether (PAE), porous SiLK, or porous silicon oxide ($SiO_2$), and the decomposable porogen material includes a porogen organic compound, which can provide porosity to the space originally occupied by the energy removable layer 113 in the subsequent processes. In addition, the energy removable layer 113 may be deposited by a CVD process, a PVD process, an ALD process, a spin-on coating process, or another applicable process.

Figure 6:
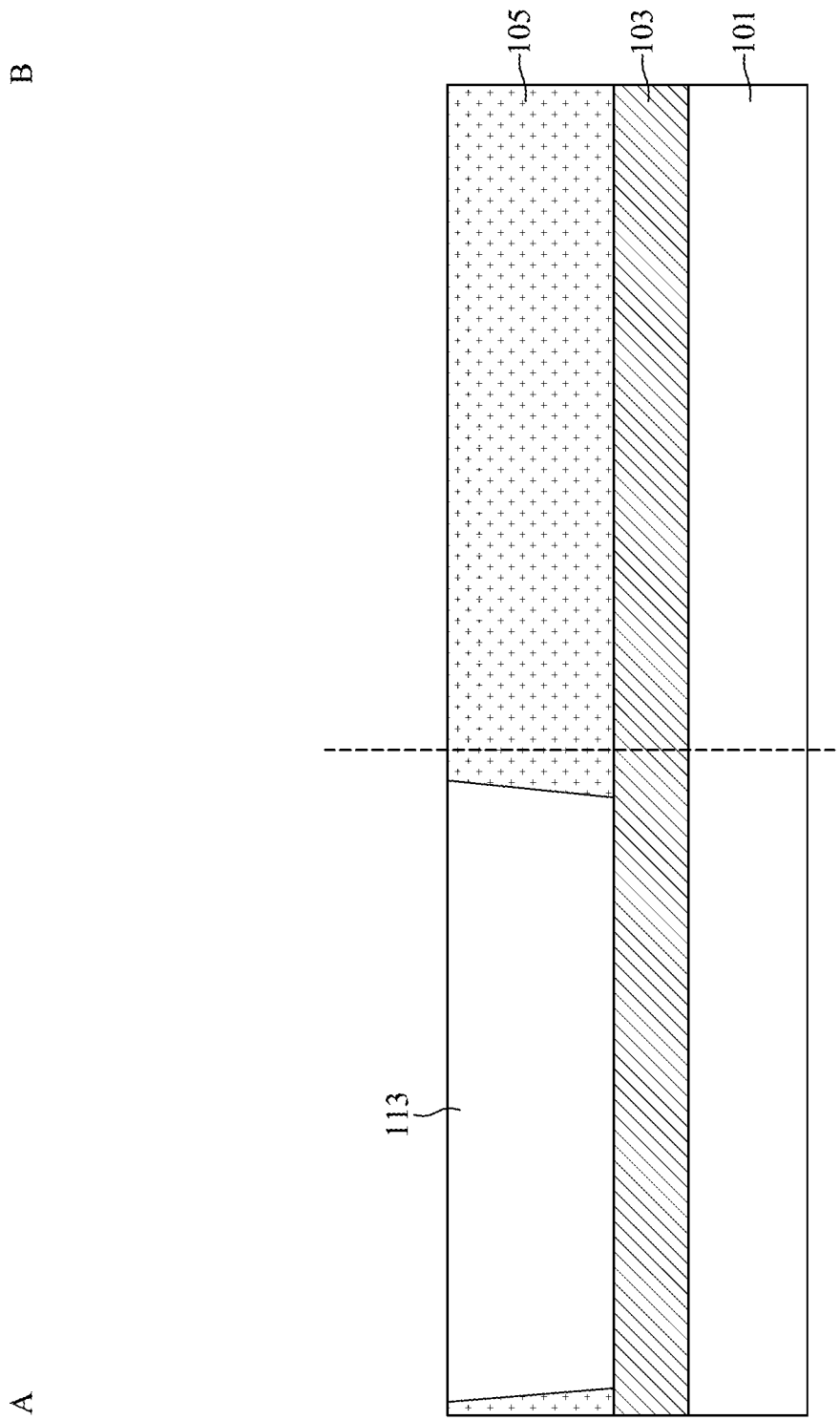
FIG. 6 is a cross-sectional view illustrating an intermediate stage of partially removing the energy removable layer during the formation of the semiconductor device structure, in accordance with some embodiments.

Then, a planarizing process is performed on the energy removable layer 113 so as to remove a portion of the energy removable layer 113, as shown in FIG. 6 in accordance with some embodiments. The planarizing process may include a chemical mechanical polishing (CMP) process, an etch-back process, or another applicable process. After the planarizing process, the top surface of the energy removable layer 113 is substantially coplanar with the top surface of the dielectric layer 105. In some embodiments, a portion of the dielectric layer 105 in the pattern-dense region A is replaced by the energy removable layer 113 during the intermediate stages shown in FIGS. 4-6, and the respective step is illustrated as the step S15 in the method 10 shown in FIG. 2.

Figure 7:
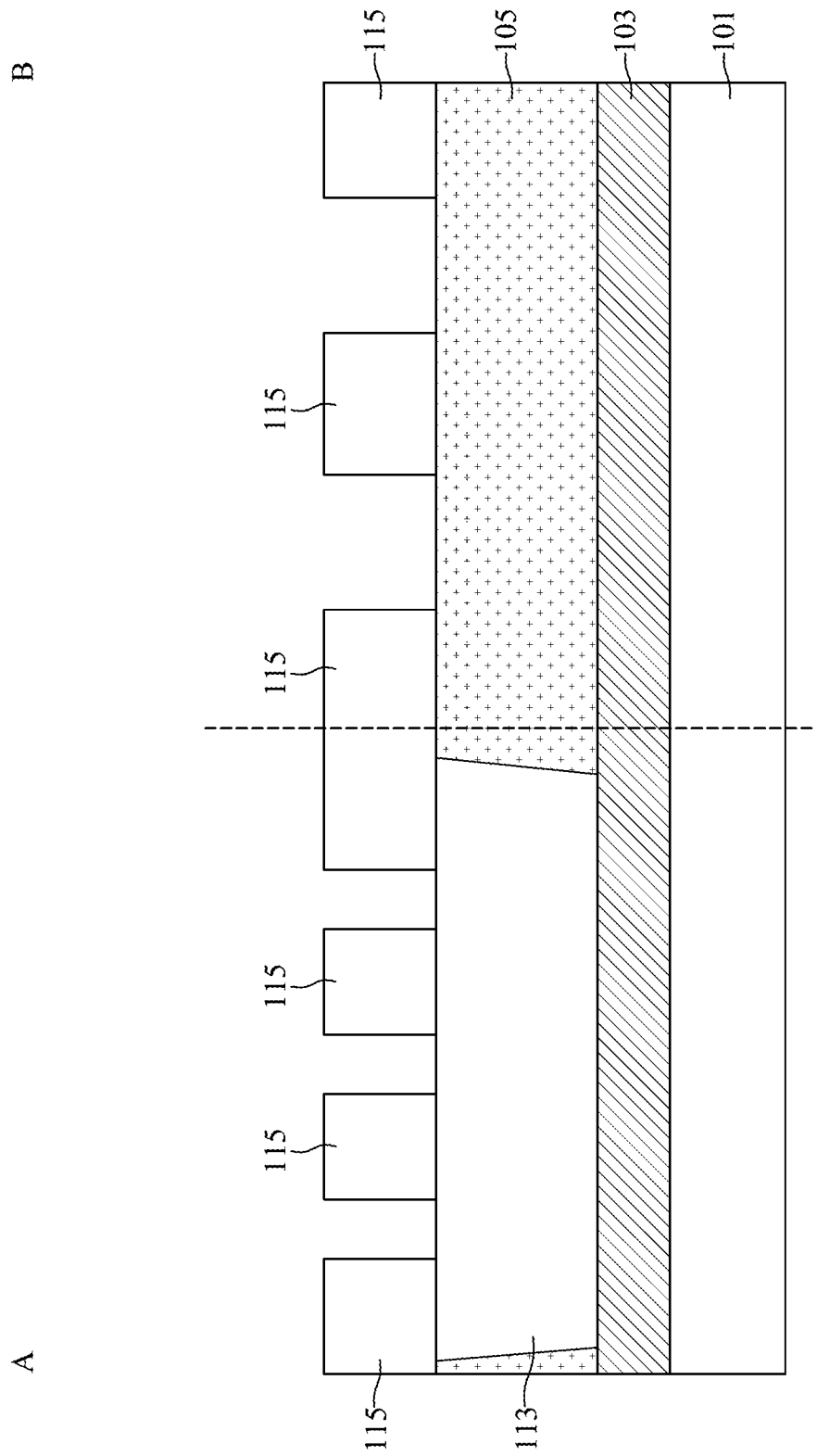
FIG. 7 is a cross-sectional view illustrating an intermediate stage of forming a patterned mask over the energy removable layer and the dielectric layer during the formation of the semiconductor device structure, in accordance with some embodiments.

Next, a patterned mask 115 is formed over the energy removable layer 113 and the dielectric layer 105, as shown in FIG. 7 in accordance with some embodiments. In some embodiments, portions of the energy removable layer 113 in the pattern-dense region A and portions of the dielectric layer 105 in the pattern-loose region B are exposed by the patterned mask 115.

Figure 8:
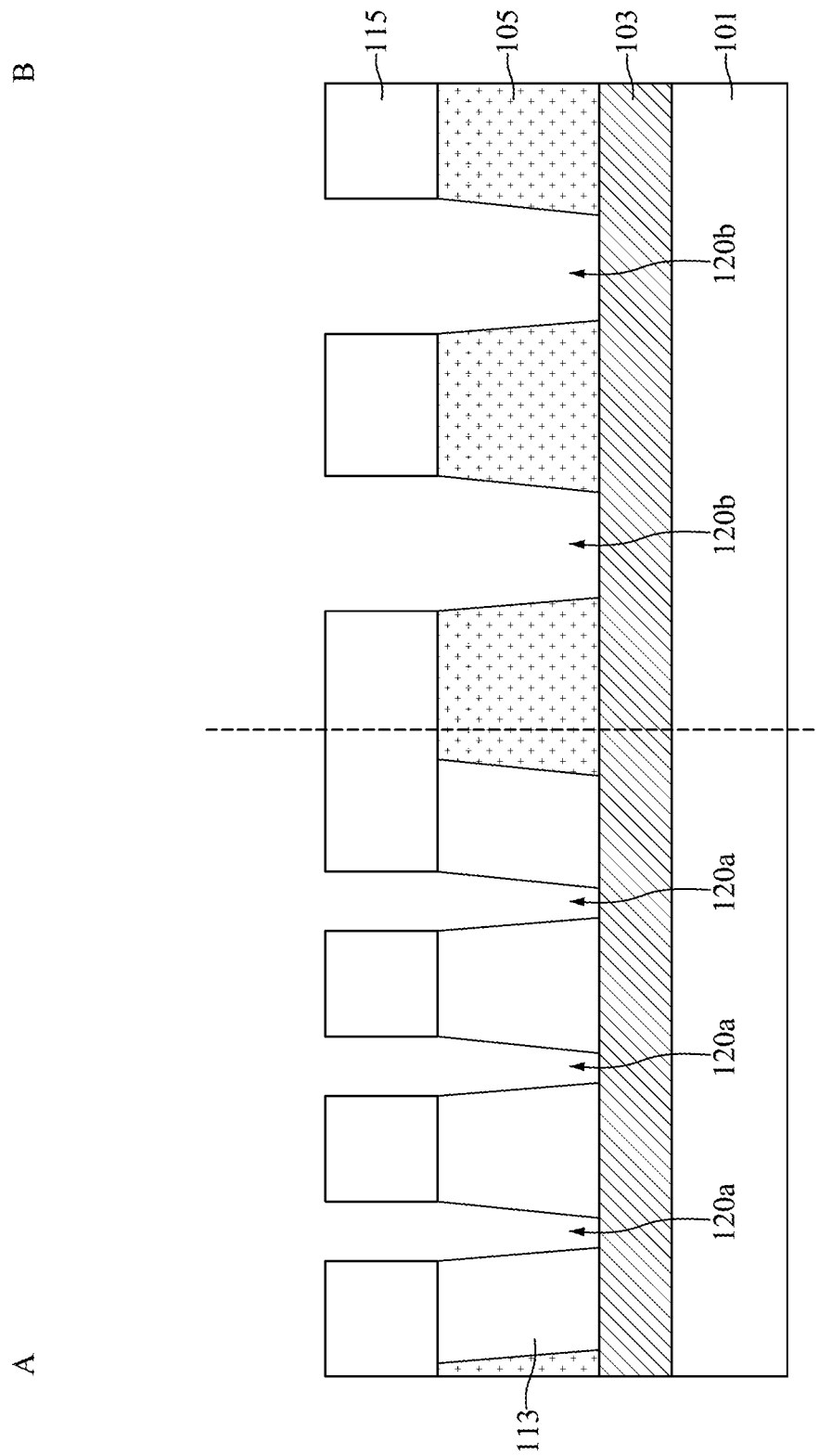
FIG. 8 is a cross-sectional view illustrating an intermediate stage of etching the energy removable layer and the dielectric layer during the formation of the semiconductor device structure, in accordance with some embodiments.

Subsequently, the energy removable layer 113 and the dielectric layer 105 are etched by using the patterned mask 115 as a mask, such that openings 120a are formed in the energy removable layer 113 and openings 120b are formed in the dielectric layer 105, as shown in FIG. 8 in accordance with some embodiments. In some embodiments, the openings 120a are in the pattern-dense region A, and the openings 120b are in the pattern-loose region B. In some embodiments, the first conductive layer 103 are partially exposed by the openings 120a and 120b. The etching process may be a wet etching process, a dry etching process, or a combination thereof. The respective step is illustrated as the step S17 in the method 10 shown in FIG. 2.

Figure 9:
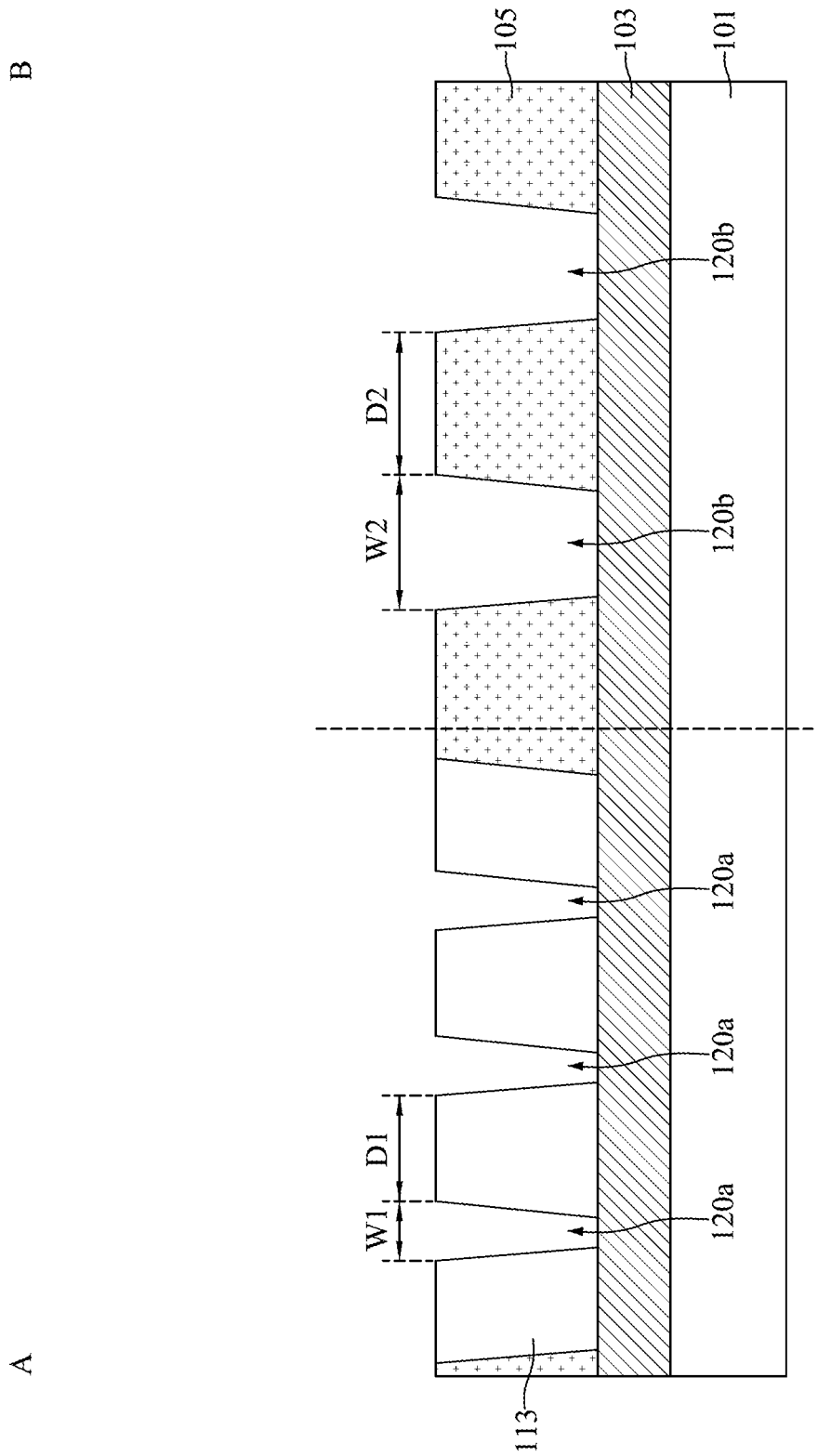
FIG. 9 is a cross-sectional view illustrating an intermediate stage of removing the patterned mask during the formation of the semiconductor device structure, in accordance with some embodiments.

After the openings 120a and 120b are formed, the patterned mask 115 is removed, as shown in FIG. 9 in accordance with some embodiments. In some embodiments, each of the openings 120a has a width W1, each of the openings 120b has a width W2, and the width W2 is greater than the width W1. In some embodiments, the widths W1 and W2 are defined as the topmost widths of the openings 120a and 120b. Additionally, in some embodiments, each adjacent pair of the openings 120a have a distance D1 therebetween, each adjacent pair of the openings 120b have a distance D2 therebetween, and the distance D2 is greater than the distance D1.

Figure 10:
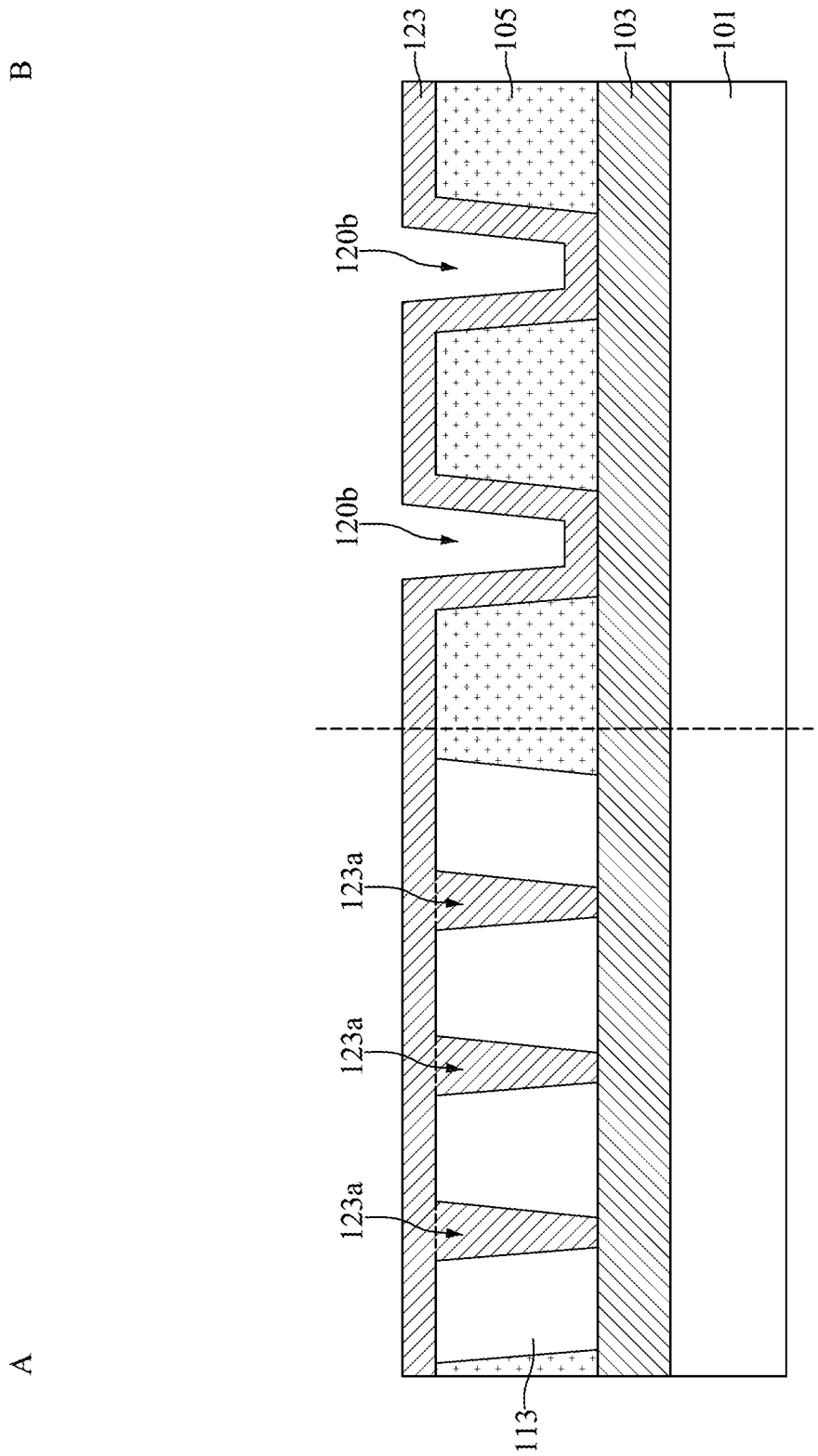
FIG. 10 is a cross-sectional view illustrating an intermediate stage of depositing a lining layer and forming first conductive plugs during the formation of the semiconductor device structure, in accordance with some embodiments.

Next, the lining layer 123 is deposited over the energy removable layer 113 and the dielectric layer 105, as shown in FIG. 10 in accordance with some embodiments. It should be noted that the openings 120a are entirely filled by the lining layer 123, and the portions of the lining layer 123 in the openings 120a form the first conductive plugs 123a. Meanwhile, each of the openings 120b is partially filled by the lining layer 123, such that the remaining portions of the openings 120b are formed over the lining layer 123. The respective step is illustrated as the step S19 in the method 10 shown in FIG. 2.

In some embodiments, since the lining layer 123 and the first conductive plugs 123a are integrally formed, the lining layer 123 and the first conductive plugs 123a are made of the same material, such as a manganese-containing material. In some embodiments, the lining layer 123 and the first conductive plugs 123a are made of (or include) copper manganese (CuMn). Moreover, the lining layer 123 may be formed by a deposition process, such as a CVD process, a PVD process, an ALD process, or another applicable process.

Figure 11:
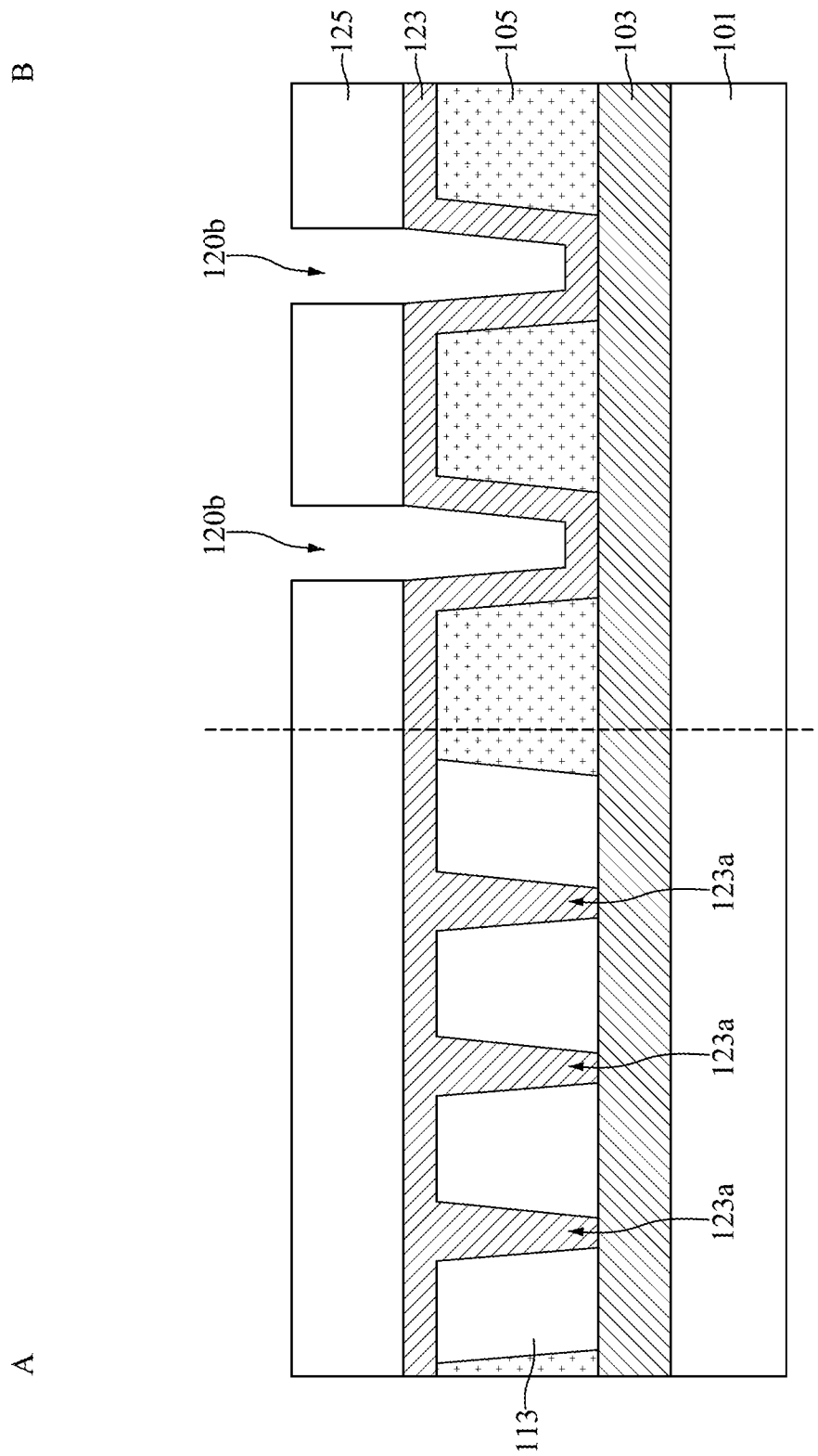
FIG. 11 is a cross-sectional view illustrating an intermediate stage of forming a patterned mask over the lining layer during the formation of the semiconductor device structure, in accordance with some embodiments.

Subsequently, a patterned mask 125 is formed over the lining layer 123, as shown in FIG. 11 in accordance with some embodiments. In some embodiments, portions of the lining layer 123 in the bottom of the openings 120b are exposed by the patterned mask 125.

Figure 12:
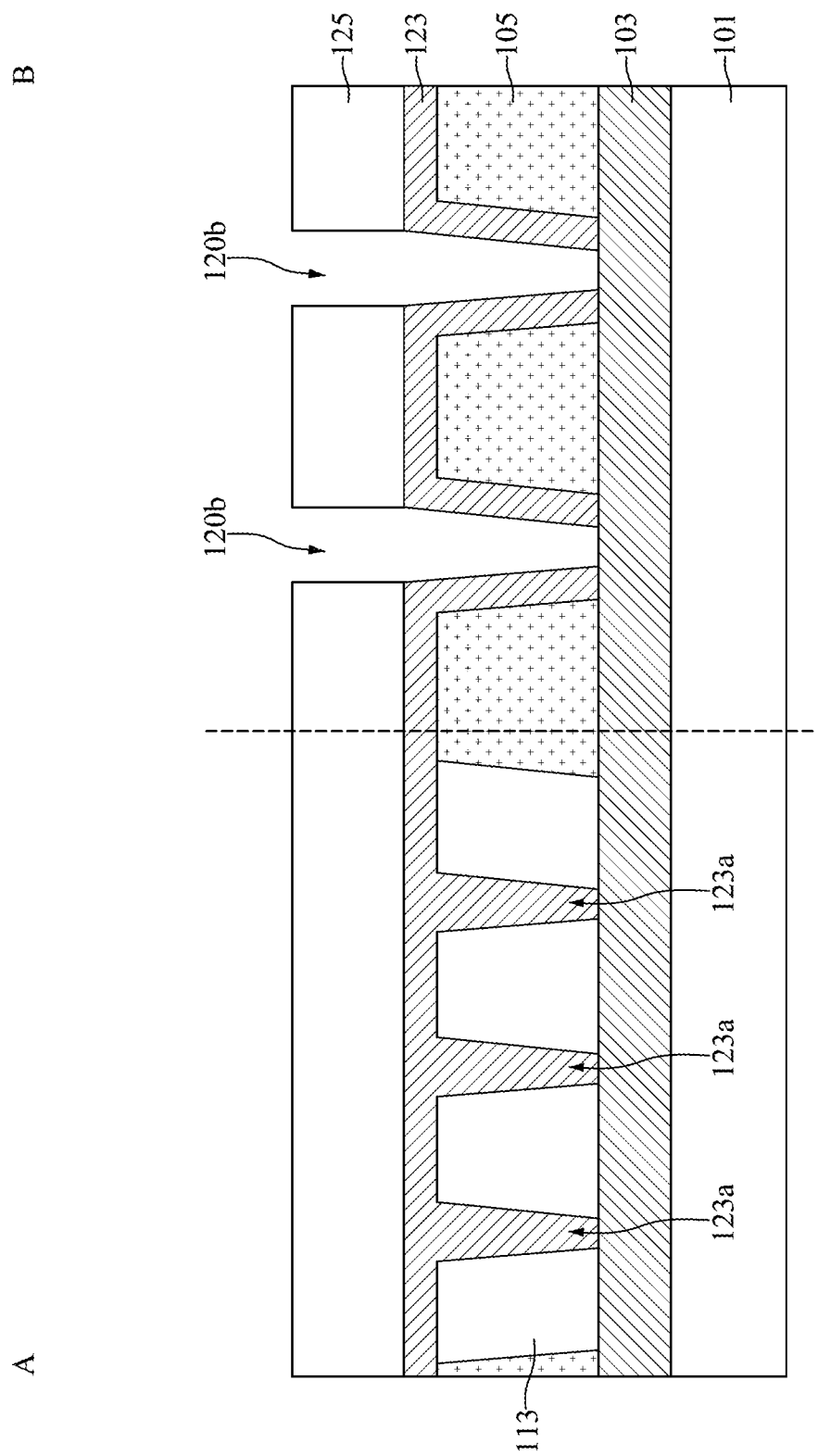
FIG. 12 is a cross-sectional view illustrating an intermediate stage of partially removing the lining layer to expose the first conductive layer during the formation of the semiconductor device structure, in accordance with some embodiments.

Then, the lining layer 123 is etched by using the patterned mask 125 as a mask, such that the first conductive layer 103 is partially exposed by the openings 120b, as shown in FIG. 12 in accordance with some embodiments. The etching process may be a wet etching process, a dry etching process, or a combination thereof. The respective step is illustrated as the step S21 in the method 10 shown in FIG. 2.

Figure 13:
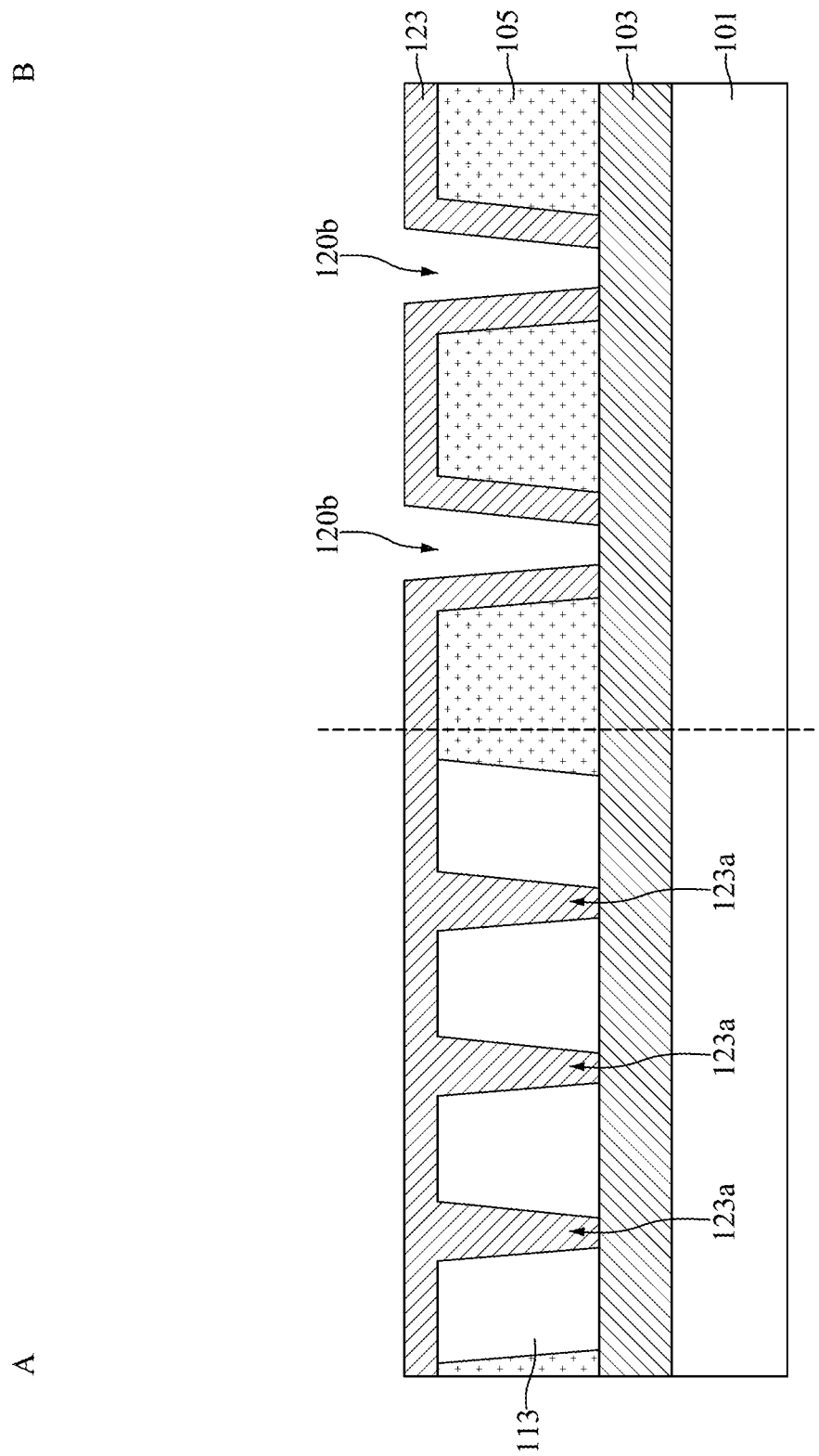
FIG. 13 is a cross-sectional view illustrating an intermediate stage of removing the patterned mask during the formation of the semiconductor device structure, in accordance with some embodiments.

After the first conductive layer 103 is partially exposed by the openings 120b in the pattern-loose region B, the patterned mask 125 is removed, as shown in FIG. 13 in accordance with some embodiments.

Figure 14:
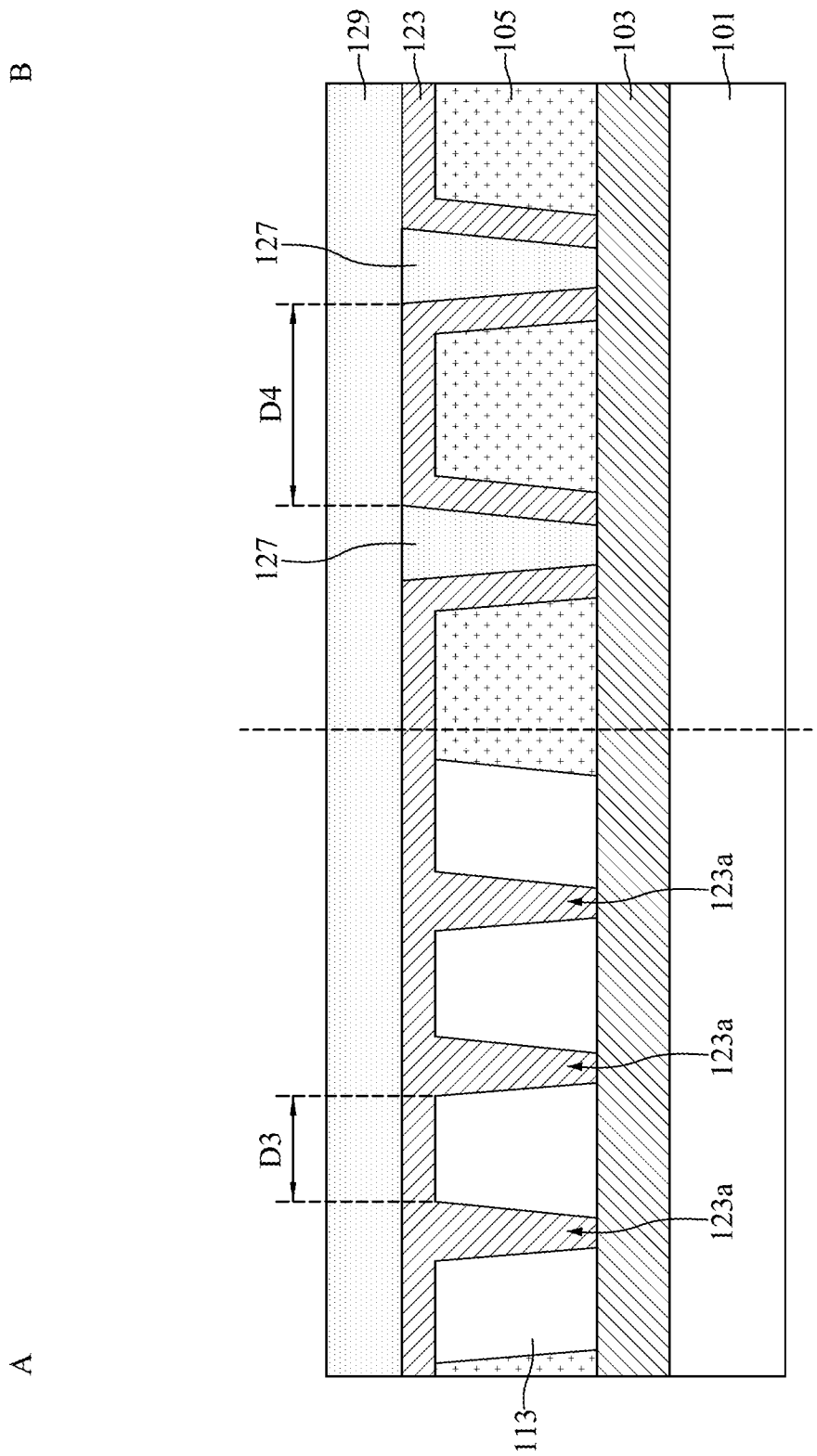
FIG. 14 is a cross-sectional view illustrating an intermediate stage of forming second conductive plugs and a second conductive layer during the formation of the semiconductor device structure, in accordance with some embodiments.

Next, the second conductive plugs 127 are formed in the openings 120b (See FIG. 13) in the pattern-loose region B, and the second conductive layer 129 is formed over the lining layer 123 and the second conductive plugs 127, as shown in FIG. 14 in accordance with some embodiments. In some embodiments, the second conductive plugs 127 and the second conductive layer 129 are integrally formed. The respective steps are illustrated as the steps S23 and S25 in the method 10 shown in FIG. 2.

Specifically, in some embodiments, the second conductive plugs 127 and the second conductive layer 129 are formed simultaneously in the same process steps, such as a deposition process and a subsequent planarizing process. The deposition process may be a CVD process, a PVD process, an ALD process, a MOCVD process, a sputtering process, a plating process, or another applicable process. The planarizing process may include a CMP process, an etch-back process, or another applicable process. In addition, in some embodiments, the second conductive plugs 127 and the second conductive layer 129 are made of (or include) copper (Cu). Additionally, in some embodiments, each adjacent pair of the first conductive plugs 123a in the pattern-dense region A have a distance D3 therebetween, each adjacent pair of the second conductive plugs 127 in the pattern-loose region B have a distance D4 therebetween, and the distance D4 is greater than the distance D3.

Figure 15:
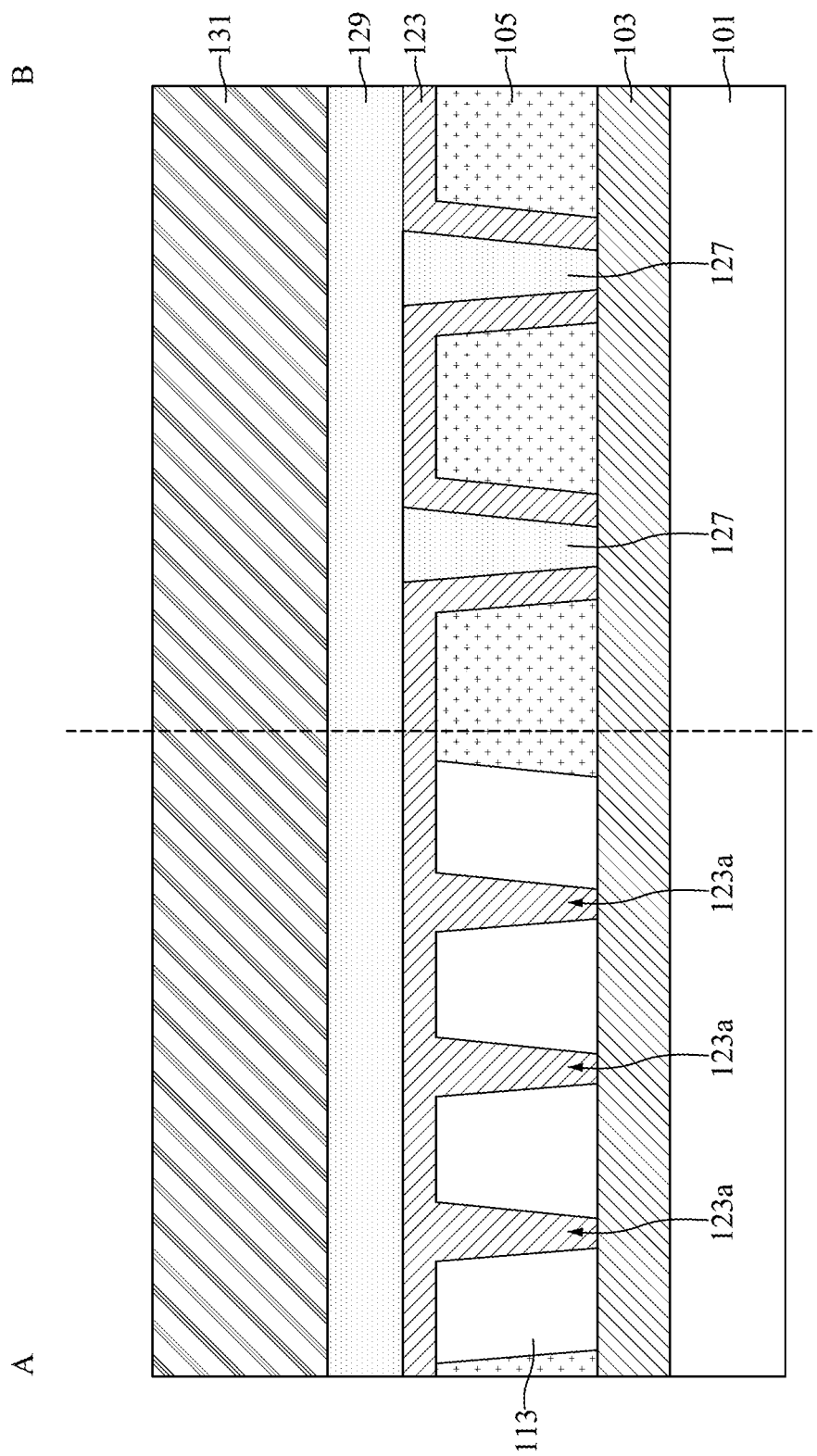
FIG. 15 is a cross-sectional view illustrating an intermediate stage of forming a dielectric layer over the second conductive layer during the formation of the semiconductor device structure, in accordance with some embodiments.

Subsequently, the dielectric layer 131 is formed over the second conductive layer 129, as shown in FIG. 15 in accordance with some embodiments. Some materials and processes used to form the dielectric layer 131 are similar to, or the same as those used to form the dielectric layer 105, and details thereof are not repeated herein.

Figure 16:
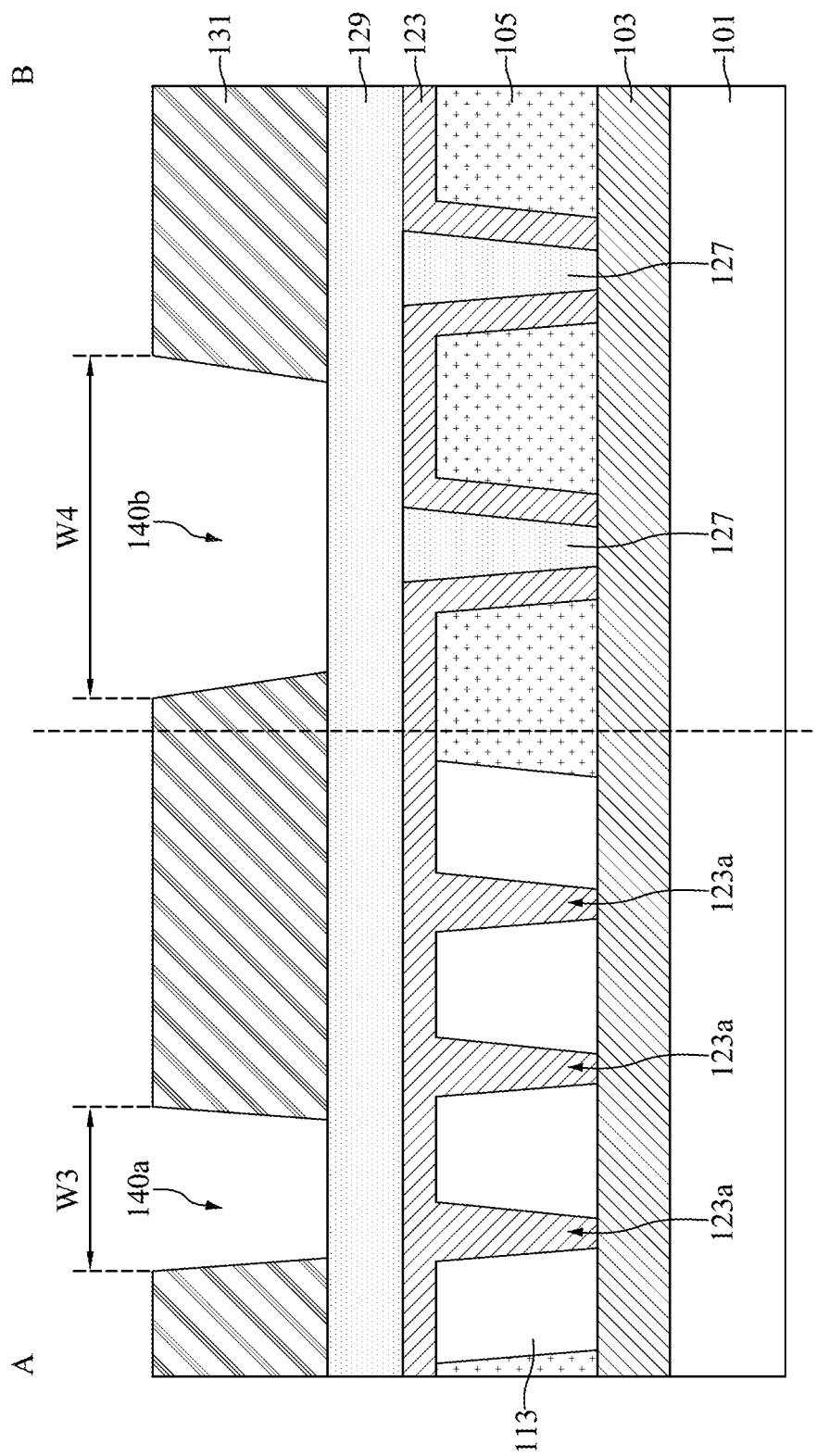
FIG. 16 is a cross-sectional view illustrating an intermediate stage of etching the dielectric layer during the formation of the semiconductor device structure, in accordance with some embodiments.

Then, the dielectric layer 131 is etched to form an opening 140a in the pattern-dense region A and an opening 140b in the pattern-loose region B, as shown in FIG. 16 in accordance with some embodiments. In some embodiments, each of the openings 140a and 140b exposes a portion of the second conductive layer 129. The etching process for forming the openings 140a and 140b may be a wet etching process, a dry etching process, or a combination thereof. In some embodiments, the opening 140a has a width W3, the opening 140b has a width W4, and the width W4 is greater than the width W3. In some embodiments, the widths W3 and W4 are defined as the topmost widths of the openings 140a and 140b.

Figure 17:
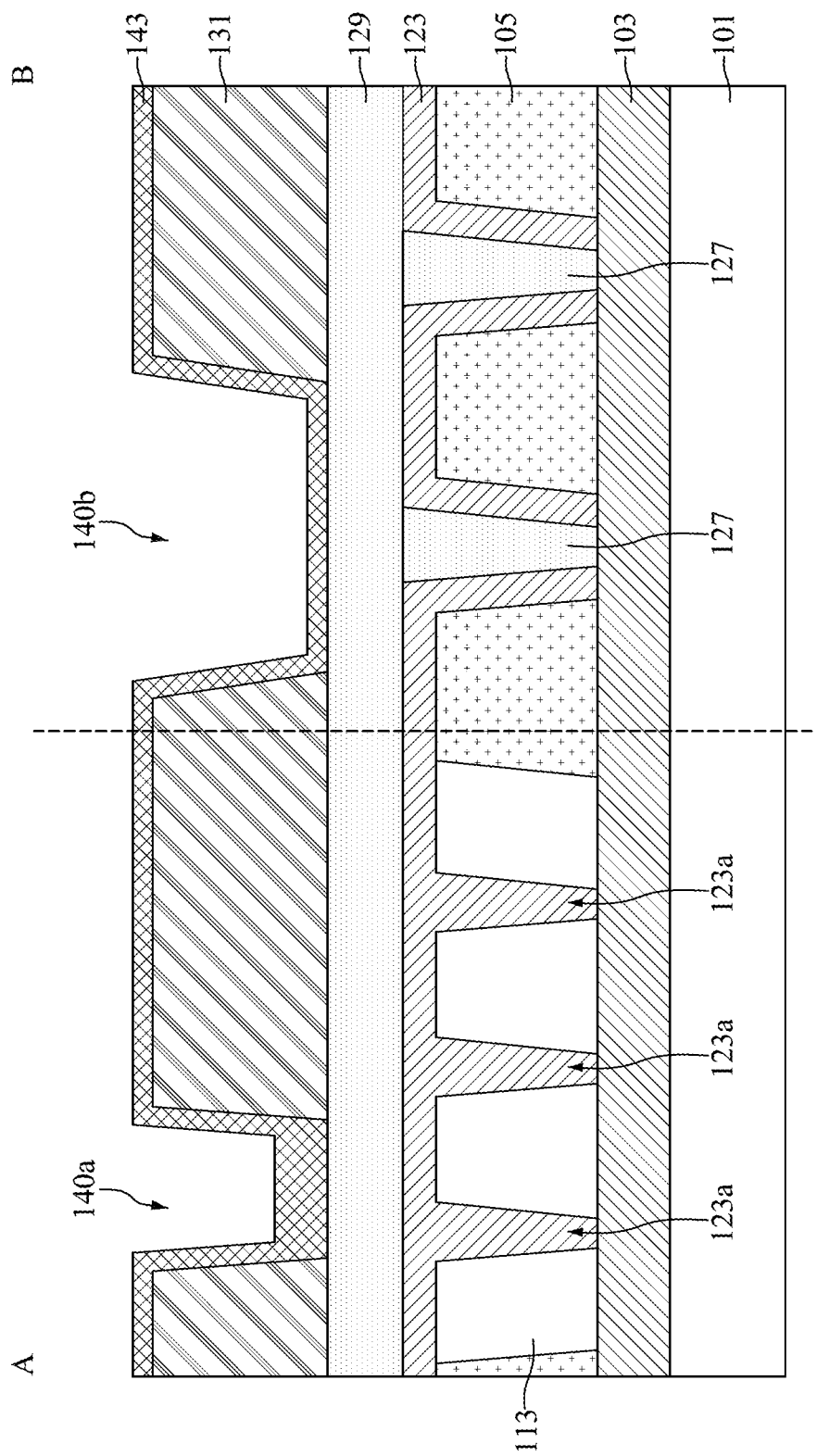
FIG. 17 is a cross-sectional view illustrating an intermediate stage of forming a lining layer during the formation of the semiconductor device structure, in accordance with some embodiments.

After the openings 140a and 140b are formed, the lining layer 143 is conformally deposited over the dielectric layer 131 and covering the sidewalls and the bottom surfaces of the openings 140a and 140b, as shown in FIG. 17 in accordance with some embodiments. In some embodiments, the lining layer 143 is made of (or include) manganese-rich manganese silicon (MnSi) or manganese (Mn). The lining layer 143 may be formed by a deposition process, such as CVD, PVD, ALD, MOCVD, sputtering, plating.

Figure 18:
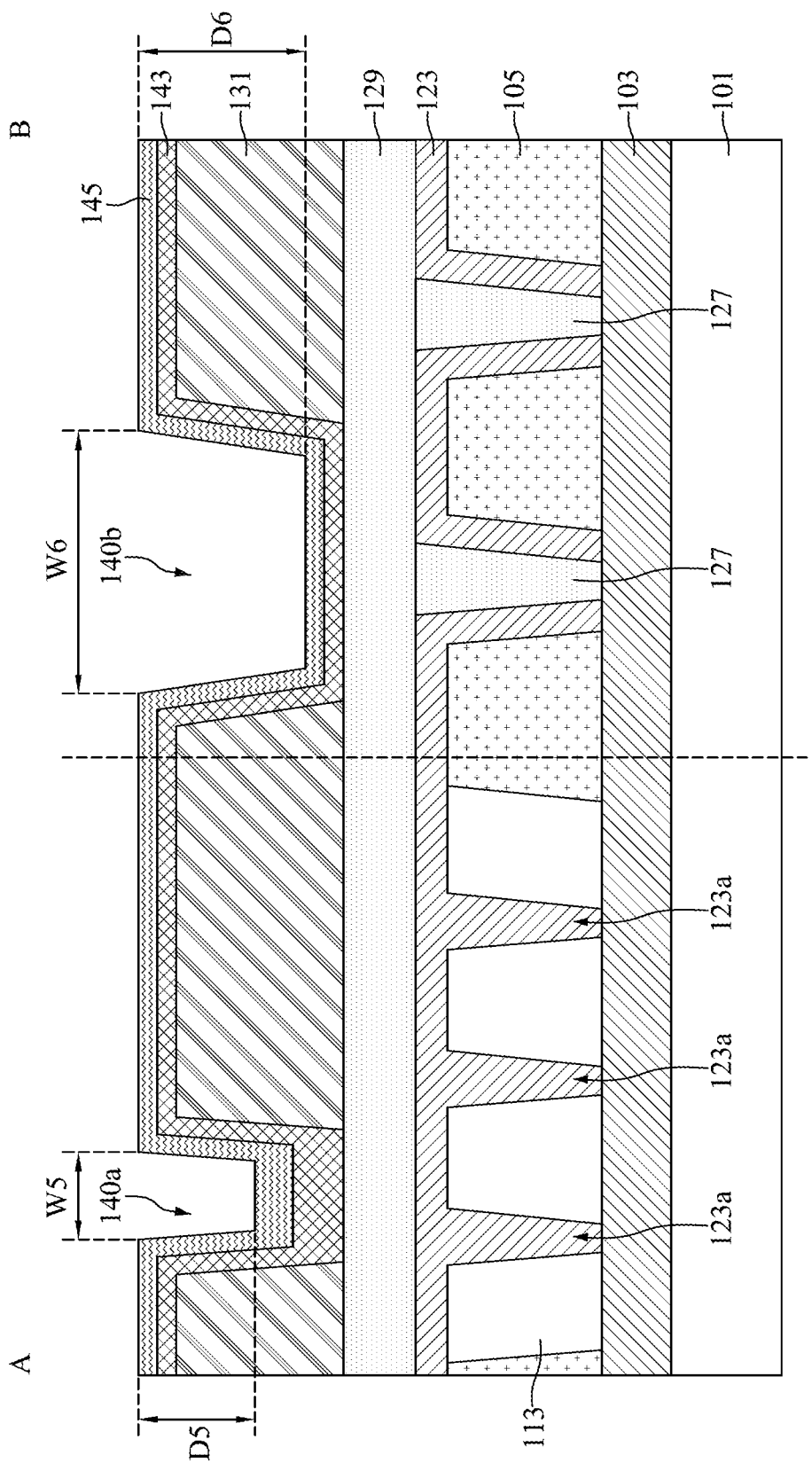
FIG. 18 is a cross-sectional view illustrating an intermediate stage of forming a lining layer during the formation of the semiconductor device structure, in accordance with some embodiments.

Next, the lining layer 145 is conformally deposited over the lining layer 143, as shown in FIG. 18 in accordance with some embodiments. In some embodiments, the lining layer 145 is made of (or include) copper manganese (CuMn). Some processes used to form the lining layer 145 are similar to, or the same as those used to form the lining layer 143, and details thereof are not repeated herein.

Figure 19:
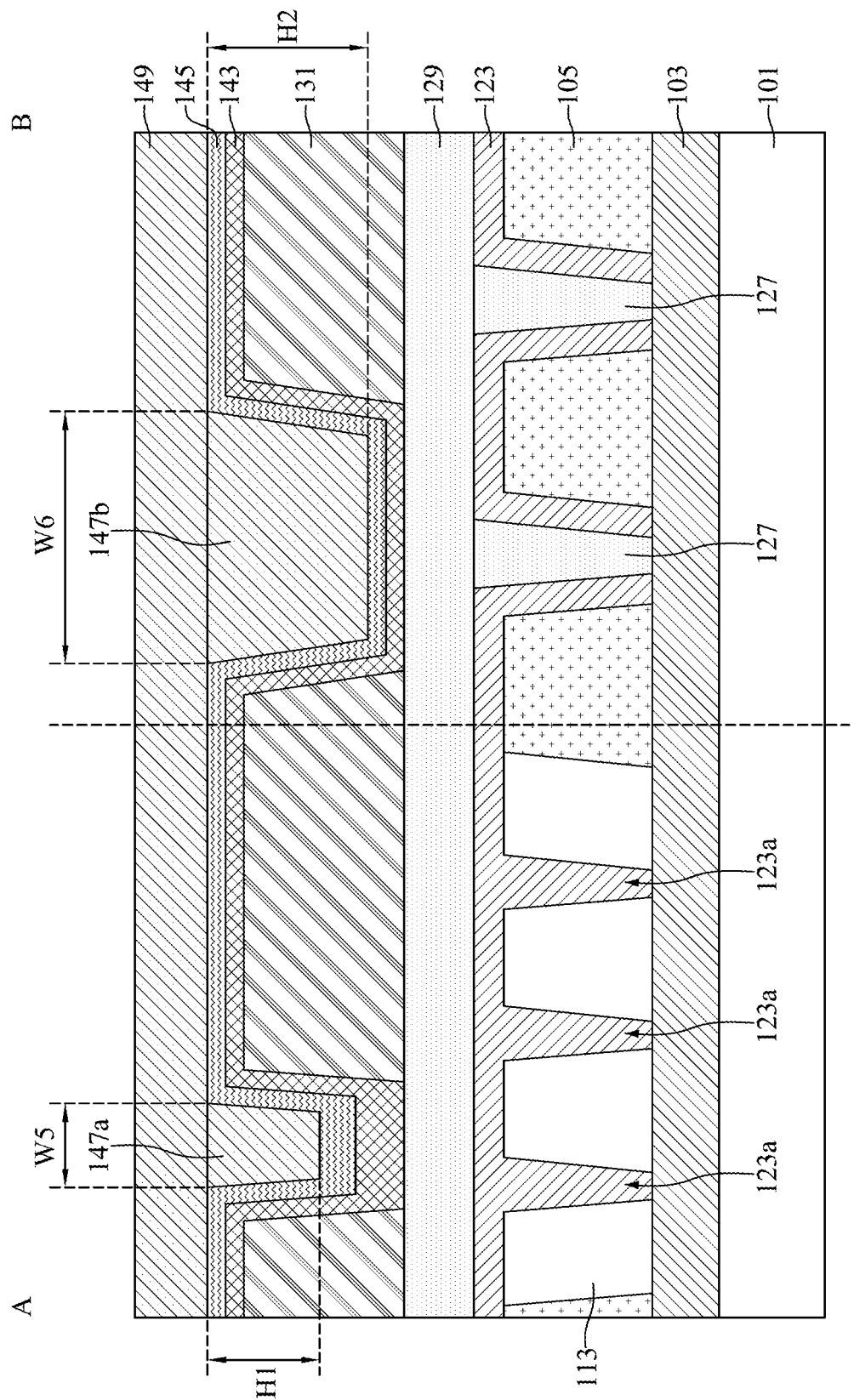
FIG. 19 is a cross-sectional view illustrating an intermediate stage of forming a first conductive structure, a second conductive structure and a third conductive layer during the formation of the semiconductor device structure, in accordance with some embodiments.

Subsequently, the first conductive structure 147a is formed in the remaining portion of the opening 140a, the second conductive structure 147b is formed in the remaining portion of the opening 140b, and the third conductive layer 149 is formed over the lining layer 145, the first conductive structure 147a and the second conductive structure 147b, as shown in FIG. 19 in accordance with some embodiments. In some embodiments, the first conductive structure 147a, the second conductive structure 147b and the third conductive layer 149 are integrally formed.

Specifically, the first conductive structure 147a, the second conductive structure 147b and the third conductive layer 149 are formed simultaneously in the same process steps, such as a deposition process and a subsequent planarizing process. The deposition process may be a CVD process, a PVD process, an ALD process, a MOCVD process, a sputtering process, a plating process, or another applicable process. The planarizing process may include a CMP process, an etch-back process, or another applicable process. In addition, in some embodiments, the first conductive structure 147a, the second conductive structure 147b and the third conductive layer 149 are made of (or include) copper (Cu).

In some embodiments, the opening 140b in the pattern-loose region B is wider than the opening 140a in the pattern-dense region A (See FIG. 16, the width W4 is greater than the width W3). Therefore, after the lining layer 145 is formed, the width W6 of the remaining portion of the opening 140b is greater than the width W5 of the remaining portion of the opening 140a, and the depth D6 of the remaining portion of the opening 140b is greater than the depth D5 of the remaining portion of the opening 140a. As a result, the width W6 of the second conductive structure 147b is greater than the width W5 of the first conductive structure 147a, and the height H2 of the second conductive structure 147b is greater than the height H1 of the first conductive structure 147a, as shown in FIG. 19 in accordance with some embodiments.

Referring back to FIG. 1, a heat treatment process is performed to transform the energy removable layer 113 into the air gaps 160 and the energy removable structures 113' surrounding the air gaps 160, in accordance with some embodiment. The energy removable structures 113' are remaining portions of the energy removable layer 113 after the heat treatment process. In some embodiments, the air gaps 160 are enclosed by the energy removable structures 113'. The respective step is illustrated as the step S27 in the method 10 shown in FIG. 2.

In some other embodiment, the heat treatment process can be replaced by a light treatment process, an e-beam treatment process, a combination thereof, or another applicable energy treatment process. After the air gaps 160 are formed, the semiconductor device structure 100 is obtained.

Figure 20:
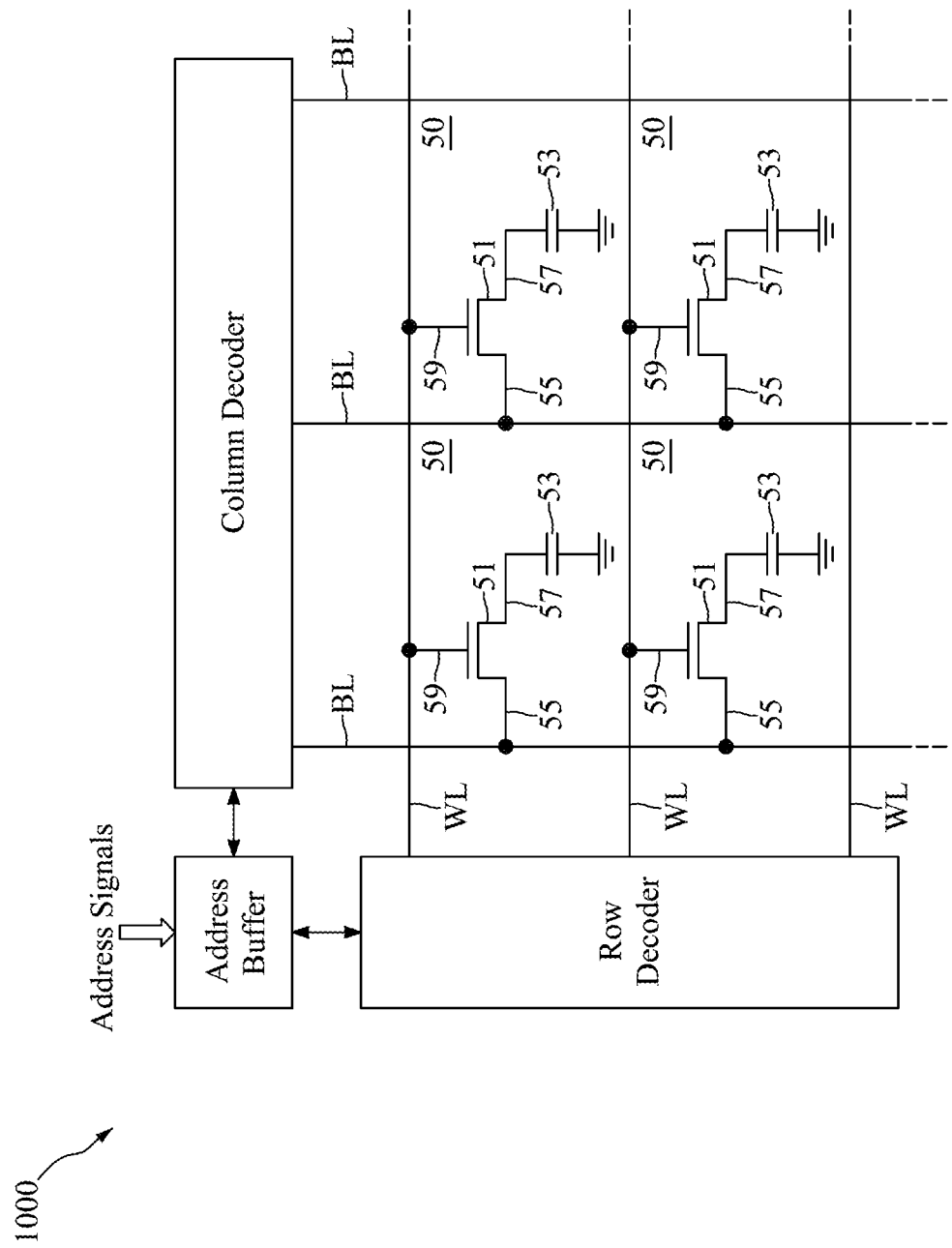
FIG. 20 is a partial schematic illustration of an exemplary integrated circuit, including an array of memory cells in accordance with some embodiments.

FIG. 20 is a partial schematic illustration of an exemplary integrated circuit, such as a memory device 1000, including an array of memory cells 50 in accordance with some embodiments. In some embodiments, the memory device 1000 includes a DRAM. In some embodiments, the memory device 1000 includes a number of memory cells 50 arranged in a grid pattern and including a number of rows and columns. The number of memory cells 50 may vary depending on system requirements and fabrication technology.

In some embodiments, each of the memory cells 50 includes an access device and a storage device. The access device is configured to provide controlled access to the storage device. In particular, the access device is a field effect transistor (FET) 51 and the storage device is a capacitor 53, in accordance with some embodiments. In each of the memory cells 50, the FET 51 includes a drain 55, a source 57 and a gate 59. One terminal of the capacitor 53 is electrically connected to the source 57 of the FET 51, and the other terminal of the capacitor 53 may be electrically connected to the ground. In addition, in each of the memory cells 50, the gate 59 of the FET 51 is electrically connected to a word line WL, and the drain 55 of the FET 51 is electrically connected to a bit line BL.

The above description mentions the terminal of the FET 51 electrically connected to the capacitor 53 is the source 57, and the terminal of the FET 51 electrically connected to the bit line BL is the drain 55. However, during read and write operations, the terminal of the FET 51 electrically connected to the capacitor 53 may be the drain, and the terminal of the FET 51 electrically connected to the bit line BL may be the source. That is, either terminal of the FET 51 could be a source or a drain depending on the manner in which the FET 51 is being controlled by the voltages applied to the source, the drain and the gate.

By controlling the voltage at the gate 59 via the word line WL, a voltage potential may be created across the FET 30 such that the electrical charge can flow from the drain 55 to the capacitor 53. Therefore, the electrical charge stored in the capacitor 53 may be interpreted as a binary data value in the memory cell 30. For example, a positive charge above a threshold voltage stored in the capacitor 53 may be interpreted as binary "1." If the charge in the capacitor 53 is below the threshold value, a binary value of "0" is said to be stored in the memory cell 30.

The bit lines BL are configured to read and write data to and from the memory cells 50. The word lines WL are configured to activate the FET 51 to access a particular row of the memory cells 50. Accordingly, the memory device 1000 also includes a periphery circuit region which may include an address buffer, a row decoder and a column decoder. The row decoder and the column decoder selectively access the memory cells 50 in response to address signals that are provided to the address buffer during read, write and refresh operations. The address signals are typically provided by an external controller such as a microprocessor or another type of memory controller.

Referring back to FIG. 1, the first conductive plugs 123a (i.e., the manganese-containing conductive plugs) are formed in the pattern-dense region A, while the second conductive plugs 127 (i.e., the copper-containing conductive plugs) are formed in the pattern-loose region B. The pattern-dense region A may be any of the regions of the memory cells 50 in the memory device 1000, and the pattern-loose region B may be any of the regions of the address buffer, the row decoder, or the column decoder in the memory device 1000.

Embodiments of the semiconductor device structure 100 and method for forming the same are provided in the disclosure. In some embodiments, the semiconductor device structure 100 includes the first conductive plugs 123a penetrating through the dielectric layer 105 and in the pattern-dense region A, the lining layer 123 covering the dielectric layer 105 and the first conductive plugs 123a, and the second conductive plugs 127 penetrating through the lining layer 123 and the dielectric layer 105 and in the pattern-loose region B. The lining layer 123 and the first conductive plugs 123a include manganese, the second conductive plugs 127 are separated from the dielectric layer 105 by the lining layer 123. The manganese-containing conductive plugs (i.e., the first conductive plugs 123a in the pattern-dense region A) and the lining layer 123 may be integrally formed, thereby reducing manufacturing cost. Moreover, the lining layer 123 may reduce or prevent voids from forming in the subsequently formed conductive plugs (i.e., the second conductive plugs 127 in the pattern-loose region B), thereby decreasing the contact resistance. As a result, the operation speed of the semiconductor device structure 100 may be increased, which significantly improves the overall device performance.

In one embodiment of the present disclosure, a semiconductor device is provided. The semiconductor device includes a first conductive layer disposed over a semiconductor substrate, and a dielectric layer disposed over the first conductive layer. The semiconductor device structure also includes a first conductive plug penetrating through the dielectric layer and in a pattern-dense region, and a lining layer covering the dielectric layer and the first conductive plug. The lining layer and the first conductive plug include manganese. The semiconductor device structure further includes a second conductive plug penetrating through the lining layer and the dielectric layer and in a pattern-loose region. The second conductive plug is separated from the dielectric layer by a portion of the lining layer. In addition, the semiconductor device structure includes a second conductive layer covering the lining layer and the second conductive plug.

In another embodiment of the present disclosure, a semiconductor device structure is provided. The semiconductor device structure includes a first conductive layer disposed over a semiconductor substrate, and a second conductive layer disposed over the first conductive layer. The semiconductor device structure also includes a plurality of first conductive plugs disposed in a pattern-dense region and between the first conductive layer and the second conductive layer, and a plurality of second conductive plugs disposed in a pattern-loose region and between the first conductive layer and the second conductive layer. The semiconductor device structure further includes an energy removable structure disposed between the plurality of first conductive plugs. An air gap is enclosed by the energy removable structure. In addition, the semiconductor device structure includes a lining layer disposed between the plurality of first conductive plugs and the second conductive layer. The lining layer and the plurality of first conductive plugs include manganese.

In yet another embodiment of the present disclosure, a method for forming a semiconductor device is provided. The method includes forming a first conductive layer over a semiconductor substrate, and forming a dielectric layer over the first conductive layer. The method also includes replacing a portion of the dielectric layer with an energy removable layer, and performing an etching process to form a first opening in the energy removable layer and a second opening in the dielectric layer. The first opening is in a pattern-dense region and the second opening is in a pattern-loose region. The method further includes depositing a lining layer over the energy removable layer and the dielectric layer. The lining layer entirely fills the first opening to form a first conductive plug, and the lining layer partially fills the second opening. In addition, the method includes forming a second conductive plug in a remaining portion of the second opening, and forming a second conductive layer over the lining layer and the second conductive plug.

The embodiments of the present disclosure have some advantageous features. By integrally forming the manganese-containing conductive plugs in the pattern-dense region and the manganese-containing lining layer, the manufacturing cost may be reduced. In addition, the resistance of the conductive plugs in the pattern-loose region surrounded by the manganese-containing lining layer may be decreased. As a result, the operation speed of the semiconductor device structure is increased, which significantly improves the overall device performance.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device structure, comprising:
   a first conductive layer disposed over a semiconductor substrate;
   a dielectric layer disposed over the first conductive layer;
   a first conductive plug penetrating through the dielectric layer and in a pattern-dense region;
   a lining layer covering the dielectric layer and the first conductive plug, wherein the lining layer and the first conductive plug comprise manganese (Mn);
   a second conductive plug penetrating through the lining layer and the dielectric layer and in a pattern-loose region, wherein the second conductive plug is separated from the dielectric layer by a portion of the lining layer; and
   a second conductive layer covering the lining layer and the second conductive plug.

2. The semiconductor device structure of claim 1, wherein the lining layer is in direct contact with the first conductive plug, and the lining layer and the first conductive plug are made of a same material.

3. The semiconductor device structure of claim 2, wherein the lining layer and the first conductive plug are made of copper manganese (CuMn).

4. The semiconductor device structure of claim 1, wherein the first conductive plug and the second conductive plug are made of different materials.

5. The semiconductor device structure of claim 1, wherein the second conductive layer is in direct contact with the second conductive plug, and the second conductive layer and the second conductive plug are made of copper (Cu).

6. The semiconductor device structure of claim 1, further comprising:
   an energy removable structure disposed in the pattern-dense region and adjacent to the first conductive plug, wherein the energy removable structure is disposed between the lining layer and the first conductive layer.

7. The semiconductor device structure of claim 6, further comprising:
   an air gap enclosed by the energy removable structure.

8. A semiconductor device structure, comprising:
   a first conductive layer disposed over a semiconductor substrate;
   a second conductive layer disposed over the first conductive layer;
   a plurality of first conductive plugs disposed in a pattern-dense region and between the first conductive layer and the second conductive layer;
   a plurality of second conductive plugs disposed in a pattern-loose region and between the first conductive layer and the second conductive layer;

an energy removable structure disposed between the plurality of first conductive plugs, wherein an air gap is enclosed by the energy removable structure; and a lining layer disposed between the plurality of first conductive plugs and the second conductive layer, wherein the lining layer and the plurality of first conductive plugs comprise manganese (Mn).

9. The semiconductor device structure of claim 8, wherein the lining layer and the plurality of first conductive plugs are made of a first material, the plurality of second conductive plugs and the second conductive layer are made of a second material, and the first material is different from the second material.

10. The semiconductor device structure of claim 9, wherein the first material is copper manganese (CuMn), and the second material is copper (Cu).

11. The semiconductor device structure of claim 8, further comprising:

a dielectric layer disposed between the first conductive layer and the second conductive layer, wherein the plurality of second conductive plugs are surrounded by the dielectric layer, the lining layer extends between the dielectric layer and the second conductive layer, and each of the plurality of second conductive plugs is separated from the dielectric layer by the lining layer.

12. The semiconductor device structure of claim 8, wherein a first distance between an adjacent pair of the plurality of first conductive plugs is less than a second distance between an adjacent pair of the plurality of second conductive plugs.

13. The semiconductor device structure of claim 8, wherein the plurality of first conductive plugs and the plurality of second conductive plugs are electrically connected to the first conductive layer and the second conductive layer.

* * * * *